(12) United States Patent
Iida

(10) Patent No.: US 10,672,942 B2
(45) Date of Patent: Jun. 2, 2020

(54) SOLAR CELL MODULE AND METHOD FOR PRODUCING SAME

(71) Applicant: Namics Corporation, Niigata (JP)

(72) Inventor: Hideyo Iida, Niigata (JP)

(73) Assignee: NAMICS CORPORATION, Niigata (JP)

(*) Notice: Subject to any disclaimer, the term of this patent is extended or adjusted under 35 U.S.C. 154(b) by 157 days.

(21) Appl. No.: 15/557,324

(22) PCT Filed: Mar. 15, 2016

(86) PCT No.: PCT/JP2016/058128
§ 371 (c)(1),
(2) Date: Sep. 11, 2017

(87) PCT Pub. No.: WO2016/152649
PCT Pub. Date: Sep. 29, 2016

(65) Prior Publication Data
US 2018/0053876 A1 Feb. 22, 2018

(30) Foreign Application Priority Data
Mar. 25, 2015 (JP) .................. 2015-062344

(51) Int. Cl.
*H01L 31/044* (2014.01)
*H01L 31/18* (2006.01)
(Continued)

(52) U.S. Cl.
CPC .. *H01L 31/1876* (2013.01); *H01L 31/022441* (2013.01); *H01L 31/0504* (2013.01); *Y02E 10/50* (2013.01); *Y02P 70/521* (2015.11)

(58) Field of Classification Search
CPC .................. H01L 31/00–078; Y02E 10/50–60
(Continued)

(56) References Cited

U.S. PATENT DOCUMENTS

| 4,562,637 A | 1/1986 | Kushima et al. |
| 8,052,036 B2 | 11/2011 | Chikaki |

(Continued)

FOREIGN PATENT DOCUMENTS

| JP | S604270 A | 1/1985 |
| JP | S6014480 A | 1/1985 |

(Continued)

OTHER PUBLICATIONS

International Search Report and Written Opinion from PCT/JP2016/058128, dated Mar. 15, 2016, and English Translation of International Search Report.

*Primary Examiner* — Bach T Dinh
(74) *Attorney, Agent, or Firm* — Westman, Champlin & Koehler, P.A.

(57) ABSTRACT

A method for producing a solar cell module is obtained that allows a wiring material to be wired by a highly productive wiring method when a solar cell module is formed by arranging the wiring material on an electrode of a solar cell. The method for producing a solar cell module includes preparing a plurality of solar cells having an electrode on at least one of a first main surface and a second main surface, arranging the plurality of solar cells so that the first main surfaces of the plurality of solar cells face roughly in the same direction, connecting the linear conductor for electrically connecting one of the electrode on the first main surface and the electrode on the second main surface of each solar cell with one continuous linear conductor, and electrically disconnecting the continuous linear conductor after the connecting the linear conductor so that the electrodes of at least one pair of adjacent solar cells among the plurality of solar cells are connected in series.

6 Claims, 10 Drawing Sheets

(51) Int. Cl.
*H01L 31/0224* (2006.01)
*H01L 31/05* (2014.01)

(58) Field of Classification Search
USPC .............................. 136/243–265; 438/57–98
See application file for complete search history.

(56) References Cited

U.S. PATENT DOCUMENTS

| | | | | |
|---|---|---|---|---|
| 2011/0265844 | A1* | 11/2011 | Storbeck | H01L 31/0504 136/244 |
| 2012/0279546 | A1* | 11/2012 | Kutzer | H01L 31/022441 136/244 |
| 2013/0152994 | A1* | 6/2013 | Schaarschmidt | H01L 31/18 136/244 |
| 2015/0059822 | A1* | 3/2015 | Krokoszinski | H01L 31/022441 136/244 |

FOREIGN PATENT DOCUMENTS

| | | | |
|---|---|---|---|
| JP | S6060775 | A | 4/1985 |
| JP | H11103078 | A | 4/1999 |
| JP | 2004111464 | A | 4/2004 |
| JP | 2004247402 | A | 9/2004 |
| JP | 2005236235 | A | 9/2005 |
| JP | 2008053625 | A | 3/2008 |
| JP | 2010258158 | A | 11/2010 |
| JP | 2013030665 | A | 2/2013 |

* cited by examiner

A: Cell substrate stocker
B: Wire Supply Roll
C: Solder Paste/Flux Coating Device
D: Temporary Crimping Rollers
E: Conductive Wire Supply Roll F: Solder Melting Heater
G: Thickness Adjustment Press
H: Wire Cutter
I: Cleaner
J: Dryer W1: Bus wire
W2: Conductive wire
S: Solder paste or flux

SOLAR CELL MODULE AND METHOD FOR PRODUCING SAME

CROSS-REFERENCE TO RELATED APPLICATION

This Application is a Section 371 National State Application of International Application No. PCT/JP2016/058128, filed Mar. 15, 2016 and published as WO2016/152649 A1 on Sep. 29, 2016, in English, the contents of which are hereby incorporated by reference in their entirety.

TECHNICAL FIELD

The present invention relates to a solar cell module electrically connecting a plurality of solar cells, and a method for producing the solar cell module.

BACKGROUND ART

Solar cells convert light energy, such as that from sunlight, to electrical energy, and their production volume has increased considerably in recent years. Crystalline silicon solar cells, which are a type of solar cell, have an impurity diffusion layer, an anti-reflection layer and a light-incident side electrode on one of the surfaces (light incident side surface) of a crystalline silicon substrate, and a back surface electrode on the other surface. Electrical power generated by the crystalline solar cells can be taken to the outside by the light-incident side electrode and the back surface electrode.

Multiple electrically connected solar cells are referred to as a solar cell module. For example, in the case of a crystalline silicon solar cell module, in order to electrically connect a plurality of solar cells, wiring materials in the manner of interconnecting metal ribbons are soldered to electrodes formed on the surfaces of the solar cells, thereby forming electrical connections between adjacent solar cells.

Patent Document 1 and Patent Document 2 disclose devices for soldering tab leads to the top surface and back surface of solar cells as an example of technology used to connect a plurality of solar cells.

In addition, Patent Document 3 discloses a device for producing a string of solar cells by electrically connecting a plurality of solar cells. The device of Patent Document 3 is characterized by being provided with a connection stage that electrically connects corresponding solar cells, an electrical characteristics inspection unit that inspects the electrical characteristics of a string formed on the aforementioned connection stage, and a string placement unit that places the aforementioned string after classifying to one of a plurality of ranks corresponding to the inspected electrical characteristics.

Patent Document 4 discloses a wiring sheet for electrically connecting back contact solar cells in which a first conductivity-type electrode and a second conductivity-type electrode are arranged on one side of a semiconductor substrate. The wiring sheet of Patent Document 4 has an insulating substrate and a first wiring material provided on the insulating substrate, the first wiring material is provided with a plurality of cell arrangement units on which the back contact solar cells are arranged, and each of the cell arrangement units contains mutually electrically insulated first and second wires and has a second wiring material between the cell arrangement units electrically insulated from the first wire and the second wire.

PRIOR ART DOCUMENTS

Patent Documents

Patent Document 1: JP 2008-053625 A
Patent Document 2: JP 2005-236235 A
Patent Document 3: JP 2004-111464 A
Patent Document 4: JP 2010-258158 A

SUMMARY OF THE INVENTION

Problem to be Solved by the Invention

A solar cell module refers to that which generates a prescribed current and voltage by suitably connecting a plurality of solar cells in series and/or in parallel. In addition, solar cell modules are typically available commercially as solar cell modules in which a plurality of suitably connected solar cells are sealed so as to have environmental resistance using a glass plate and sealing material and the like (also referred to as solar cell panels or solar power generation panels). Normally, the plurality of solar cells that compose a solar cell module (which may also be simply referred to as "cells") is electrically connected by wiring materials. The wiring materials are connected to prescribed electrodes formed on the surface of adjacent solar cells. Furthermore, the wiring materials for connecting a plurality of solar cells are also referred to as linear conductors in the present description since they are typically conductors having a linear shape in the manner of ribbons or wires.

Crystalline silicon solar cells consist of double-sided electrode-type solar cells 10, having electrodes on the top surface and back surface of a crystalline silicon substrate (single-crystalline silicone substrate or polycrystalline silicon substrate), and back contact solar cells 110 having an electrode only on the back surface of the crystalline silicon substrate. FIG. 6 shows a schematic plan view as viewed from the light-incident side surface (which may simply be referred to as the top surface) of the double-sided electrode-type solar cell 10. FIG. 7 shows a schematic plan view as viewed from the surface of the back side (which may simply be referred to as the back surface) of the double-sided electrode-type solar cell 10. FIG. 10 shows a schematic cross-sectional view of the double-sided electrode-type solar cell 10. In addition, FIG. 11 shows a schematic plan view as viewed from the surface of the back side of the back contact solar cell 110. In addition, FIG. 12 shows a schematic cross-sectional view of the back contact solar cell 110.

FIG. 8 indicates the manner in which double-sided electrode-type solar cells 10a and 10b are connected by a linear conductor 20a. In addition, FIG. 9 shows a schematic cross-sectional view of the area indicated by reference symbol A in FIG. 8. The linear conductor 20 is connected to a top surface bus bar electrode 14 (electrode 14 of a first polarity) of the cell 10a (see FIG. 6) by soldering and the like. In addition, the linear conductor 20a goes around to the back surface of the cell 10b, and is connected to a back surface bus bar 16 (electrode 16 of a second polarity) by soldering and the like (see FIG. 7). As a result, the electrode 14 of a first polarity on the top surface of the cell 10a and the electrode 16 of a second polarity can be electrically connected by the linear conductor 20a. Thus, the cell 10a and the cell 10b are connected in series by the linear conductor 20a.

Furthermore, in the case the electrode 14 of a first polarity is a positive electrode, the electrode 16 of a second polarity is a negative electrode. In addition, in the case the electrode 14 of a first polarity is a negative electrode, the electrode 16 of a second polarity is a positive electrode.

Typically in a solar cell module, a state referred to as a string is formed in which a prescribed number, such as 10 to 12, of solar cells 10 are electrically connected in a line by alternately connecting the top surface bus bar electrode 14 of a solar cell 10 and the back surface bus bar electrode 16 of an adjacent solar cell 10 on the top and back sides by soldering. Furthermore, a ribbon-like solder-coated copper wire is typically used for the linear conductor 20.

An example of a specific process for connecting the solar cells 10 by linear conductors 20 as shown in FIGS. 8 and 9 is explained using FIG. 13 using the example of solar cells 10 having two bus bar electrodes.

First, two ribbons (linear conductors 20) coated with flux are cut to a length equivalent to about 2 cells (1) and placed on a soldering stage (2). The solar cells are installed thereon so that the two ribbons placed on the stage in step (1) overlap with the locations of the back surface bus bar electrodes of the cells (3). Next, the two ribbons cut to a length equivalent to about 2 cells are installed in the same manner as step (2) so as to overlap with the top surface bus bar electrodes (4). A pressure pin is then pressed against these two ribbons followed by hot-pressing using hot air or other heating method (such as a halogen lamp, laser or electromagnetic induction) (5). As a result, a total of four ribbons can be soldered, consisting of two ribbons soldered to the top surface electrodes of the cells and two ribbons soldered to the back surface electrodes. Next, the cell on which soldering has been completed is transferred (a distance of one cell) and discharged from the stage so as to allow the upper two ribbons to remain on the stage (6). The top surface electrodes and back surface electrodes between adjacent cells can be connected in series by repeating this procedure. A string consisting of a plurality of cells (typically, about 10 to 12 cells) connected in series is formed by subsequently repeating this procedure.

A wiring material, obtained by coating a ribbon-like copper wire having a width of 1 mm to 2.5 mm and thickness of 0.15 mm to 0.3 mm with solder (tin-lead solder or lead-free solder such as tin-silver-copper solder), is used for the wiring material (linear conductor 20 or ribbon). The length of wiring material cut from a reel is determined by considering the length resulting from adding a cell interval (1 mm to 30 mm) to a length equal to roughly twice the dimensions of the cell (5 inches or 6 inches in the diagonal direction).

Methods have been examined that use a large number of wiring materials having a narrower width (low light blocking rate) for the purpose of improving the efficiency of solar cell modules (such as a method using 3 or 4 bus bar electrodes). In this case, the procedure used when wiring the wiring materials becomes complex and yield tends to decrease when connecting cells in series in the manner described above.

In addition, development has recently proceed on crystalline silicon solar cell modules employing a multi-wire structure for the purpose of further improving the efficiency of solar cell modules and reducing the amount of conductive paste containing expensive silver that is used to form electrodes. In contrast to conventional solar cell modules employing bus bar electrodes that use two to four ribbon wires, modules having a multi-wire structure employ multi-bus bar electrodes using 10 wires or more. The interval between bus bar electrodes in solar cells employing a multi-wire structure is reduced to about ⅓ to ⅕ that of conventional crystalline silicon solar cells. Consequently, the effect of poor performance caused by the line resistance (bulk resistance) of finger electrodes can be diminished, thereby making it possible to reduce the wire thickness and film thickness of finger electrodes. In addition, this is also useful for reducing the usage of conductive paste that contains expensive silver.

A plurality of copper wires coated with a low melting point metal and having a diameter of about 0.3 mm are used as wiring materials in currently proposed methods for producing solar cell modules employing a multi-wire structure. These wiring materials are installed in a wiring device after preparing in a form obtained by alternately attaching a fixing film over both sides of copper wires preliminarily positioned in parallel at equal intervals and then winding into the shape of a coil. Series connection of a plurality of solar cells using these wiring materials can be carried out in the same manner as the aforementioned example of using the solar cells 10 having two bus bar electrodes. Namely, a sheet of a length equivalent to roughly two cells is first punched out from a coil-shaped wiring material installed in a wiring device. Next, the sheet is attached to finger electrodes on the top surface of the solar cells while applying pressure and heat using the same method as that of the wiring machine of FIG. 13 in the aforementioned example of using two bus bar electrodes in the solar cells 10. Next, after the cell has been moved by a distance corresponding to the size of one cell, the sheet is peeled off, and a string is formed by repeating this procedure.

However, in the case of the aforementioned multi-wire structure, the procedure extending from cutting of the wiring material to discharge is basically the same as conventional methods using ribbon wire. In addition, in the case of a multi-wire structure, it is necessary to attach a large number of wiring materials to a sheet as well as peel off the sheet.

Methods in which cells are connected using wiring materials as described above have the problems indicated below.

(1) Since cutting of the wiring material is carried out prior to the step in which the wiring material is attached to a cell, handling of the shortened wiring material after cutting is complex. In particular, when the number of bus bars increases as a result of employing multiple bus bars, handing and the entire process becomes increasingly complicated.

(2) Since, after cutting wiring materials, it is necessary to individually align the shortened wiring materials with the bus bar electrodes, there is increased likelihood of the occurrence of misalignment.

(3) Since it is necessary to adhere the wiring material to a bus bar after having transferred a single solar cell to a prescribed position, there are limitations on the maximum production rate.

(4) There is a lack of flexibility with respect to changes in electrode pattern.

(5) It is necessary to add steps such as a step of preparing a roll having wire attached thereto and a step of peeling off the sheet in the case of employing a multi-wire structure, thereby making the device increasingly complicated.

(6) Disposal of the waste sheet is required in the case of employing a multi-wire structure.

On the other hand, the following type of method is employed for module wiring in back contact solar cells (refer to Patent Document 4). Namely, a wiring sheet having a wiring pattern is first formed by chemical etching after having attached a copper foil to the sheet. Next, a cell is arranged thereon and the sheet and the cell are joined with a conductive adhesive or solder paste. However, a wiring sheet for a back contact solar cell has the shortcomings of being more expensive and resulting in higher module costs in comparison with the case of double-sided electrode-type solar cells using a solder-coated ribbon as a wiring sheet.

Therefore, an object of the present invention is to provide a method for producing a solar cell module capable of arranging a wiring material thereon by employing a highly productive wiring method when forming the solar cell module by arranging a wiring material on the electrodes of a solar cell.

In addition, an object of the present invention is to provide a solar cell module that can be produced with high productivity.

Means for Solving the Problem

In conventional wiring methods in which a plurality of solar cells are connected in series by connecting the solar cells with a plurality of wiring materials, a conductor is first cut to a length required to connect adjacent cells, and the cut conductors are then connected in series extending from the top surface electrode to the back surface electrode of the adjacent cell. The inventors of the present invention arrived at the finding that the productivity of solar cell modules does not improve due to handling of the shortened wiring material following cutting of the wiring material being excessively complex.

As a result of further conducting studies on the productivity of solar cell modules, the inventors of the present invention found that the productivity of solar cell modules can be improved by employing a method in which, differing from the prior art, cutting of a linear conductor is carried out after having connected a cell electrode and conductor with a linear conductor (wiring material). More specifically, further examination of the application of this method led to completion of the present invention.

Thus, the present invention employs the following configurations in order to solve the aforementioned problem. The present invention provides a method for producing a solar cell module as described in the following Configurations 1 to 13 and a solar cell module as described in the following Configurations 14 and 15.

(Configuration 1)

Configuration 1 of the present invention is a method for producing a solar cell module that includes:

preparing a plurality of solar cells having a first main surface and a second main surface and having an electrode on at least one main surface of the first main surface and the second main surface, arranging the plurality of solar cells so that the first main surfaces of the plurality of solar cells face roughly in the same direction, connecting a linear conductor for electrically connecting the plurality of solar cells with at least one continuous linear conductor in order to electrically connect one of the electrode on the first main surface and the electrode on the second main surface of each solar cell with one continuous linear conductor, and forming an electrical connection between adjacent solar cells so that the electrodes of at least one pair of adjacent solar cells among the plurality of solar cells are connected in series, which includes electrically disconnecting the continuous linear conductor after the connecting the linear conductor.

According to Configuration 1 of the present invention, a continuous linear conductor is electrically disconnected after the connecting the linear conductor when producing a solar cell module using double-sided electrode-type solar cells. Consequently, a wiring material can be wired by a highly productive wiring method when forming a solar cell module by arranging a wiring material (linear conductor) on electrodes of the solar cells. Furthermore, the phrase "electrically connect one of the electrode on the first main surface and the electrode on the second main surface of each solar cell with one continuous linear conductor" refers to connecting the electrodes on both first main surfaces of a pair of adjacent solar cells, while also referring to connecting one of the electrode on the first main surface and the electrode on the second main surface of a pair of adjacent solar cells.

(Configuration 2)

Configuration 2 of the present invention is the method for producing a solar cell module described in Configuration 1, wherein the connecting the linear conductor includes electrically connecting at least one of each electrode of the first main surface and each electrode of the second main surface of a plurality of solar cells with at least one continuous linear conductor.

According to Configuration 2 of the present invention, at least one of each electrode of the first main surface and each electrode of the second main surface are electrically connected with at least one continuous linear conductor when producing a solar cell module using solar cells. Consequently, a wiring material can be wired by a highly productive wiring method when forming the solar cell module.

(Configuration 3)

Configuration 3 of the present invention is the method for producing a solar cell module described in Configuration 2, wherein the plurality of solar cells has an electrode of a first polarity on the first main surface and an electrode of a second polarity on the second main surface, the connecting the linear conductor includes electrically connecting the electrode of a first polarity on the first main surface of the plurality of solar cells with at least one continuous first linear conductor, and electrically connecting the electrode of a second polarity on the second main surface of the plurality of solar cells with at least one continuous second linear conductor, and the forming the electrical connection between adjacent solar cells includes:

(1) forming an electrically continuous section between adjacent solar cells, electrically continuous section creating electrical continuity between a first linear conductor that connects electrodes of the first polarity of adjacent solar cells and a second linear conductor that connects electrodes of the second polarity of adjacent solar cells, (2) electrically disconnecting the first linear conductor between the electrically continuous section and the electrode of the first polarity of one solar cell among the pair of adjacent solar cells, and (3) electrically disconnecting the second linear conductor between the electrically continuous section and the electrode of the second polarity of the other solar cell among the pair of adjacent solar cells.

According to Configuration 3, the forming an electrical connection between adjacent solar cells includes (1) the formation of a prescribed electrically continuous section, (2) disconnecting a linear conductor at a prescribed section, and (3) further disconnecting a linear conductor at a prescribed section as described above. Consequently, a wiring material can be wired more reliably by a highly productive wiring method when forming a solar cell module by arranging a wiring material (linear conductor) on electrodes of double-sided electrode-type solar cells.

(Configuration 4)

Configuration 4 of the present invention is the method for producing a solar cell module described in Configuration 3, wherein formation of an electrically continuous section between adjacent solar cells in the first linear conductor and the second linear conductor is carried out by one type of method selected from among pressure welding between the linear conductors, welding, melting a low melting point metal layer coated onto the surface of the linear conductors, melting and integrating solder layers, inserting a lead wire, melting solder by supplying a solder paste and adhering by applying a conductive paste, or a combination thereof.

According to Configuration 4 of the present invention, an electrically continuous section that maintains an electrical connection can be formed by forming an electrically continuous section between adjacent solar cells by a prescribed method.

(Configuration 5)

Configuration 5 of the present invention is the method for producing a solar cell module described in Configuration 2, wherein the plurality of solar cells have both electrodes having both a first polarity and a second polarity on the second main surface, the arranging the plurality of solar cells includes arranging the plurality of solar cells so that the lengthwise direction of the electrode of the first polarity and the electrode of the second polarity is the same direction as the direction in which the plurality of solar cells are arranged, the connecting the linear conductor includes electrically connecting each of the plurality of solar cells with at least one continuous linear conductor over the lengthwise direction of the electrode of the first polarity and the electrode of the second polarity, and the forming an electrical connection between adjacent solar cells includes:

electrically disconnecting the continuous linear conductors between adjacent solar cells other than the linear conductor that continuously connects an electrode of one polarity of one of the solar cells with the electrode of the other polarity of the other solar cell, and electrically disconnecting the continuous linear conductor between the electrode of one polarity and the electrode of the other polarity in each of the plurality of solar cells.

According to Configuration 5 of the present invention, a continuous linear conductor is electrically disconnected following the connecting the linear conductor when producing a solar cell module using a back contact solar cells. Consequently, a wiring material can be wired by a highly productive wiring method when forming a solar cell module by arranging a wiring material on the electrodes of a solar cell.

(Configuration 6)

Configuration 6 of the present invention is the method for producing a solar cell module described in Configuration 1, wherein the connecting the linear conductor including electrically connecting electrodes on different main surfaces of two adjacent solar cells among the plurality of solar cells with at least one continuous linear conductor.

According to Configuration 6 of the present invention, a wiring material can be wired more reliably by a highly productive wiring method when forming a solar cell module arranging a wiring material (linear conductor) on the electrodes of the double-sided electrode-type solar cells.

(Configuration 7)

Configuration 7 of the present invention is the method for producing a solar cell module described in Configuration 6, wherein the plurality of solar cells has an electrode of a first polarity on the first main surface and an electrode of a second polarity on the second main surface, the connecting the linear conductor includes electrically connecting a first linear conductor, which connects an electrode of a first polarity of one solar cell and an electrode of a second polarity of the other solar cell, and a second linear conductor, which connects an electrode of a second polarity of one solar cells and an electrode of a first polarity of the other solar cell in two adjacent solar cells, and the forming an electrical connection between adjacent solar cells includes:

electrically disconnecting the first linear conductor between the two adjacent solar cells, and electrically disconnecting the second linear conductor between the two adjacent solar cells and other solar cells adjacent to the two adjacent solar cells.

According to Configuration 7 of the present invention, a wiring material can be wired more reliably by a highly productive wiring method when forming a solar cell module as a result of the method for producing a solar cell module having connecting the linear conductor and forming an electrical connection between adjacent solar cells.

(Configuration 8)

Configuration 8 of the present invention is the method for producing a solar cell module described in any of Configurations 1 to 7, wherein the continuous linear conductor is a simple linear conductor or has a coating layer of solder and/or a low melting point metal on the surface of the simple linear conductor.

According to Configuration 8 of the present invention, a desired linear conductor can be obtained as a result of the continuous linear conductor being a simple linear conductor or having a coating layer of solder and/or a low melting point metal on the surface of the simple linear conductor.

(Configuration 9)

Configuration 9 of the present invention is the method for producing a solar cell module described in any of Configurations 1 to 8, wherein the connecting the linear conductor includes electrically connecting electrodes with at least one continuous linear conductor by adhering by crimping, soldering, brazing or applying a conductive paste.

According to Configuration 9 of the present invention, an electrical connection can be formed between electrodes and a linear conductor by electrically connecting the electrodes with at least one continuous linear conductor according to a prescribed method.

(Configuration 10)

Configuration 10 of the present invention is the method for forming a solar cell module described in any of Configurations 1 to 9, wherein electrical disconnection of the continuous linear conductor is carried out by mechanically cutting with a rotary blade, shearing, fusing, sublimation or making the linear conductor non-conductive.

According to Configuration 10 of the present invention, wiring of a wiring material (linear conductor) in a solar cell module can be carried out by electrically disconnecting a continuous linear conductor by a prescribed method in forming an electrical connection between adjacent solar cells.

(Configuration 11)

Configuration 11 of the present invention is the method for producing a solar cell module described in any of Configurations 1 to 10, wherein the arranging the plurality of solar cells includes arranging a plurality of solar cells corresponding to the number of solar cells in a single module in roughly the same plane, and arranging the solar cells to form a plurality of strings arranged in parallel, the strings consisting of a prescribed number of a plurality of solar cells arranged in series in a line, and the forming an electrical connection between adjacent solar cells includes forming an electrical connection between adjacent solar cells so that the electrodes of all adjacent solar cells that form strings are connected in series.

According to Configuration 11 of the present invention, a string of solar cell modules can be formed by a highly productive wiring method.

(Configuration 12)

Configuration 12 of the present invention is the method for producing a solar cell module described in Configuration 11, wherein a plurality of strings are arranged so that adjacent strings have mutually opposite polarity in the connecting direction, and includes connecting the plurality of strings contained in the solar cell module in series by electrically connecting an end of a string with an end of another adjacent string.

According to Configuration 12 of the present invention, since a plurality of strings is arranged so that adjacent strings have mutually opposite polarity in the connecting direction, adjacent strings can be connected in series by electrically connecting the ends of the adjacent strings.

(Configuration 13)

Configuration 13 of the present invention is the method for producing a solar cell module described in Configuration 11 or 12, wherein, when solar cells corresponding to the number of lines of strings in a single module are defined as one row, connecting the electrodes and the linear conductors of the solar cells, forming an electrically continuous section with linear conductors orthogonal to the linear conductors, and cutting both linear conductors are carried out for each row while sequentially advancing one row at a time to connect all of the solar cells corresponding to the number of solar cells in a single module in series.

According to Configuration 13 of the present invention, when solar cells corresponding to the number of lines of strings in a single module are defined as one row, the solar cells can be wired by linear conductors while sequentially advancing one row at a time. Consequently, production of solar cell modules can be carried out with higher productivity.

(Configuration 14)

Configuration 14 of the present invention is a solar cell module containing a plurality of solar cells electrically connected by linear conductors, wherein the solar cell module has at least one string, and the string has a prescribed number of a plurality of solar cells in which mutually adjacent solar cells are connected in series in a line, the solar cells have an electrode of a first polarity on a first main surface and an electrode of a second polarity on a second main surface, a first linear conductor is electrically connected to the electrode of a first polarity on the first main surface of the solar cells, a second linear conductor is electrically connected to the electrode of a second polarity on the second main surface of the solar cells, the first linear conductor of one of the solar cells and the second linear conductor of the other solar cell are electrically connected by an electrically continuous section in a pair of adjacent solar cells, the first linear conductor is electrically disconnected between the electrically continuous section and the electrode of the first polarity of one of the pair of adjacent solar cells, and the second linear conductor is electrically disconnected between the electrically continuous section and the electrode of the second polarity of the other solar cell of the pair of adjacent solar cells.

In the solar cell module of Configuration 14 of the present invention, the first linear conductor of one of the solar cells and the second linear conductor of the other solar cell in a pair of adjacent solar cells are electrically connected by an electrically continuous section, and the first linear conductor and the second linear conductor are electrically disconnected at prescribed locations. A solar cell module having such a structure can be produced by the solar cell module production method of the present invention as previously described. Thus, the solar cell module can be produced with high productivity.

(Configuration 15)

Configuration 15 of the present invention is the solar cell module described in Configuration 14, wherein a plurality of strings are arranged so that adjacent strings having mutually opposite polarity in the connecting direction, and the plurality of strings contained in the solar cell module are connected in series by electrically connecting an end of a string with an end of another adjacent string.

In the solar cell module of Configuration 15 of the present invention, as a result of a plurality of strings being arranged so that adjacent strings have mutually opposite polarity in the connecting direction, and the end of a string is electrically connected to the end of another adjacent string, a plurality of strings contained in the solar cell module can be connected in series. As a result, a solar cell module can be obtained that has a high output voltage.

Effect of the Invention

According to the present invention, a solar cell module able to be produced with high productivity can be obtained by arranging wiring materials according to a highly productive wiring method when forming a solar cell module by arranging wiring materials on the electrodes of solar cells.

In addition, according to the present invention, a solar cell module can be obtained that can be produced with high productivity.

MODE FOR CARRYING OUT THE INVENTION

Figure 1:
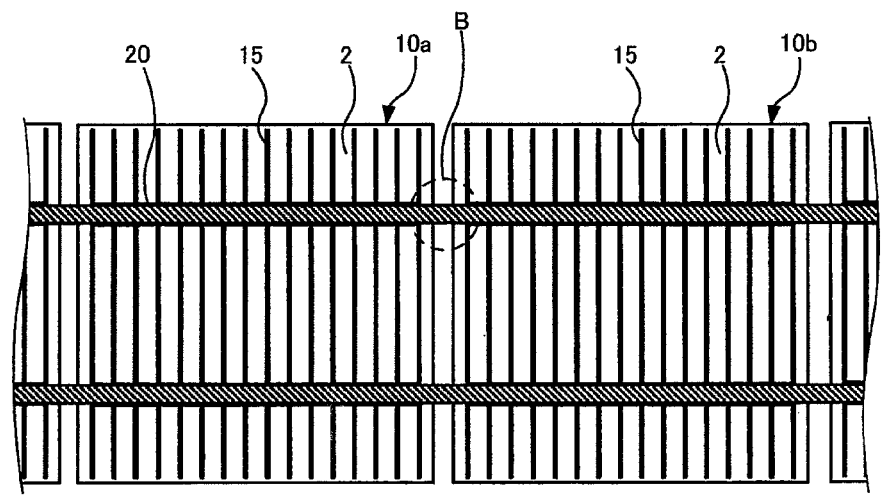
FIG. 1 is a schematic plan view showing an example of electrically connecting electrodes on the light incident side surface of a plurality of double-sided electrode-type solar cells with two continuous linear conductors.

The present invention is a method for producing a solar cell module. A solar cell module refers to that in which a plurality of solar cells are electrically connected.

There are numerous types of solar cells depending on the materials used, and examples thereof include crystalline silicon solar cells such as single-crystalline silicon solar cells or polycrystalline silicon solar cells, amorphous silicon solar cells, cadmium-telluride solar cells, gallium-arsenide solar cells and CIS solar cells. In the case of crystalline silicon solar cells, solar cells are produced using plate-like crystalline silicon for the substrate. Thus, the resulting crystalline silicon solar cells are also in the form of plates and a single plate-like solar cell is also referred to as a "solar cell". Solar cell modules can be produced by electrically connecting a plurality of solar cells. Furthermore, electrically connecting a plurality of solar cells in series in a line may also be referred to as a string. A solar cell module is composed of a single or multiple strings.

The following provides an explanation of the present invention using the example of a crystalline silicon solar cell module. However, the present invention relates to a production method for producing a solar cell module by electrically connecting plate-like solar cells. Thus, the solar cell module production method of the present invention can be applied in the case of producing a solar cell module using plate-like solar cells regardless of the type of solar cell.

As used herein, "crystalline silicon" encompasses single-crystalline silicon and polycrystalline silicon. In addition, a "crystalline silicon substrate" refers to a crystalline silicon material formed into a suitable form, e.g., a plate-like form for forming an element, such as an electrical element or an electronic element. Any method of producing crystalline silicon may be employed. For example, in the case of single-crystalline silicon, the Czochralski method may be used, while in the case of polycrystalline silicon, a casting method may be used. In addition, crystalline silicon produced by other methods, such as polycrystalline silicon ribbon produced by the ribbon pulling method, as well as polycrystalline silicon formed on a different substrate, such as glass, may also be used as a crystalline silicon substrate. In addition, a "crystalline silicon solar cell" refers to a solar cell produced by using a crystalline silicon substrate.

There are various types of crystalline silicon solar cells depending on the structure thereof, and examples thereof include double-sided electrode-type solar cells having electrodes on both the top and back surfaces, heterojunction solar cells, passivated emitter and rear cell (PERC) solar cells, back contact (back contact type) solar cells having an electrode on the back surface only, metal wrap-through (MWT) solar cells, and emitter wrap-through (EWT) solar cells. The solar cell module production method of the present invention can be preferably applied in the case of using the various types of crystalline silicon solar cells listed above.

The following provides an explanation of the detailed structure of a crystalline silicon solar cell using the examples of a double-sided electrode-type solar cell 10 and back contact solar cell 110.

Figure 6:
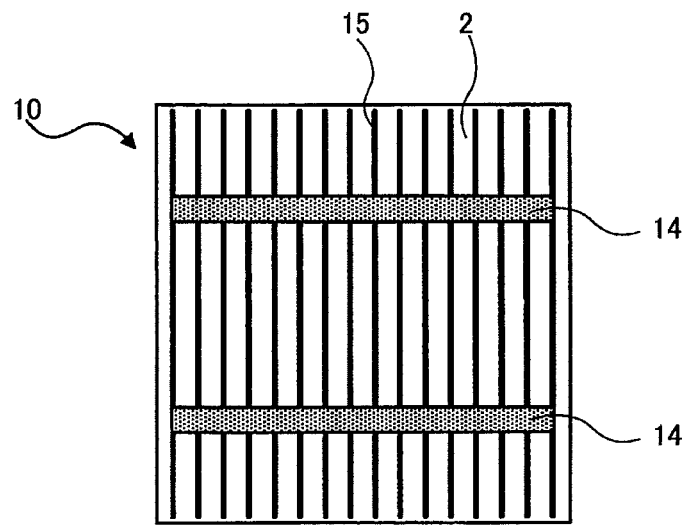
FIG. 6 is a schematic plan view of the light incident side surface of an example of a double-sided electrode-type solar cell.
Figure 7:
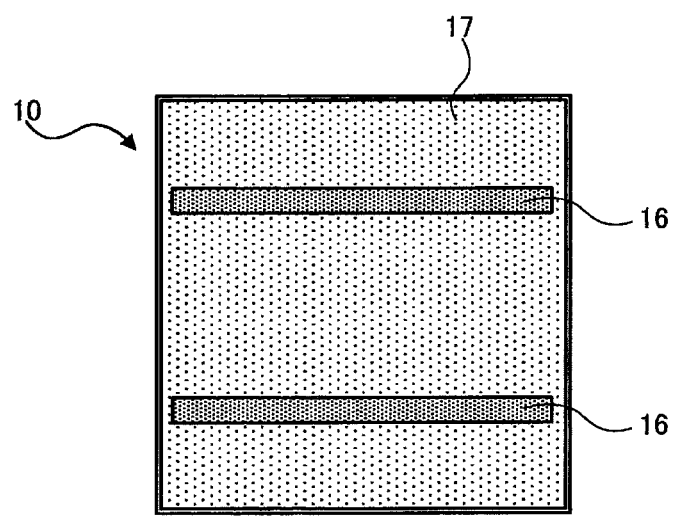
FIG. 7 is a schematic plan view of the back surface of an example of a double-sided electrode-type solar cell.
Figure 8:
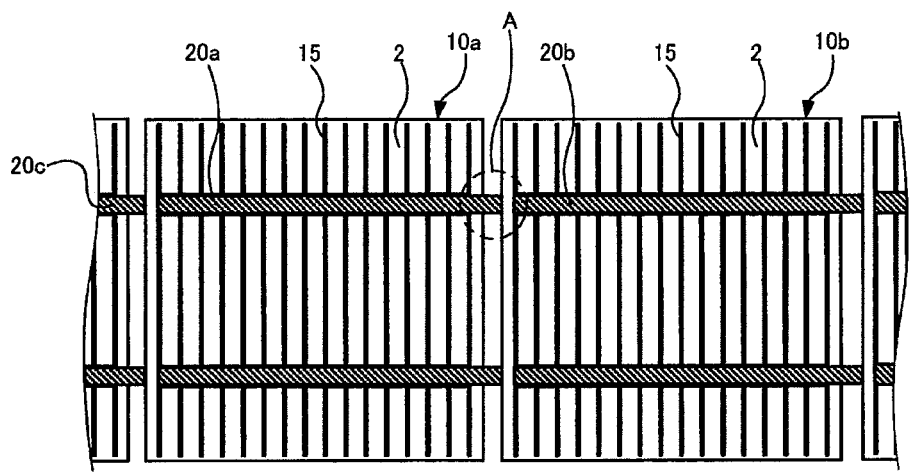
FIG. 8 is a schematic plan view of a light incident side surface showing an example of the manner in which a plurality of double-sided electrode-type solar cells is connected in a conventional solar cell module.
Figure 9:
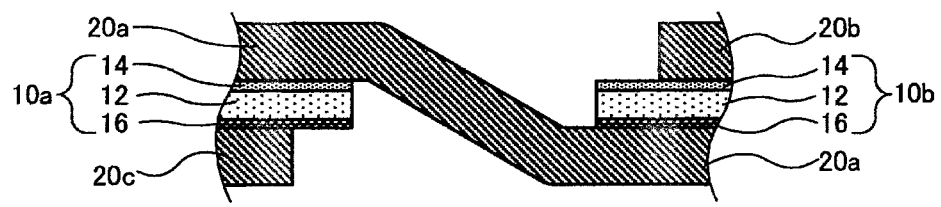
FIG. 9 is a schematic cross-sectional view in the vicinity of the dotted line circle indicated with reference symbol A in FIG. 8.
Figure 10:
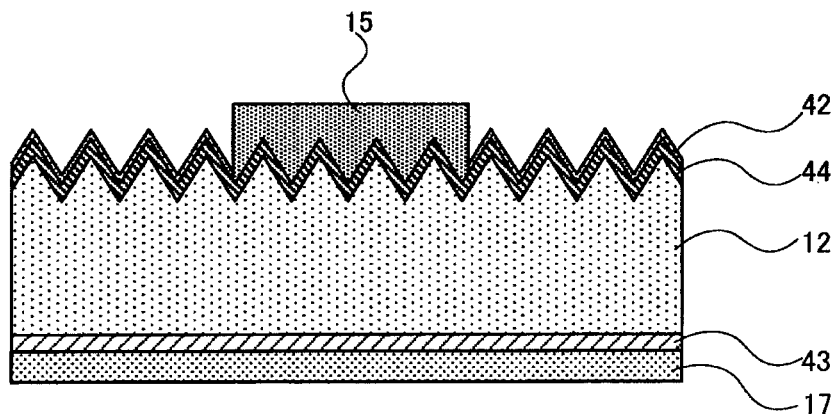
FIG. 10 is a schematic cross-sectional view of the vicinity of an electrode in an example of a double-sided electrode-type solar cell.

A schematic plan view of the light incident side surface is shown in FIG. 6, a schematic plan view of an example of the back surface is shown in FIG. 7, and a schematic cross-sectional view of the vicinity of a light-incident side finger electrode is shown in FIG. 10, all using the example of the double-sided electrode-type solar cell 10. In a crystalline silicon solar cell, an n-type diffusion layer (n-type silicon layer) 44 is typically formed on the top surface in the form of the light incident side surface of a p-type crystalline silicon substrate 12. An anti-reflection film 42 is formed on the n-type diffusion layer 44. Moreover, a pattern of the top surface electrode (light-incident side electrode) 15 is printed on the anti-reflection film 42 using a conductive paste by screen printing and the like, and the top surface electrode 15 is formed by drying and firing the conductive paste. During this firing, the top surface electrode (light-incident side electrode) 15 can be formed so as to contact the n-type diffusion layer 44 by firing the conductive paste through the anti-reflection film 42 (fire through). Furthermore, "fire through" refers to creating electrical continuity between the top surface electrode 15 and the n-type diffusion layer 44 by utilizing the action of glass frit and the like contained in the conductive paste on an insulating film in the form of the anti-reflection film 42 during firing. A back full surface electrode 17 is typically formed over nearly the entire surface of the back surface side because it is not necessary that light enters from the back surface side of the p-type silicon substrate 12. A p-n junction is formed at the interface between the p-type silicon substrate 12 and the n-type diffusion layer 44. Light such as sunlight passes through the anti-reflection film 42 and the n-type diffusion layer 44, enters the p-type silicon substrate 12, and is absorbed during the course thereof resulting in the generation of electron-hole pairs. These electron-hole pairs are such that electrons are isolated in the top surface electrode 15 while holes are isolated in the back full surface electrode 17 due to an electric field generated by the p-n junction. The electrons and holes are taken out to the outside via these electrodes in form of electrical current. Furthermore, holes can also be isolated in the top surface electrode 15 and electrons can also be isolated in the back full surface electrode 17 by forming the p-n junction opposite from that shown in FIG. 10.

Figure 11:
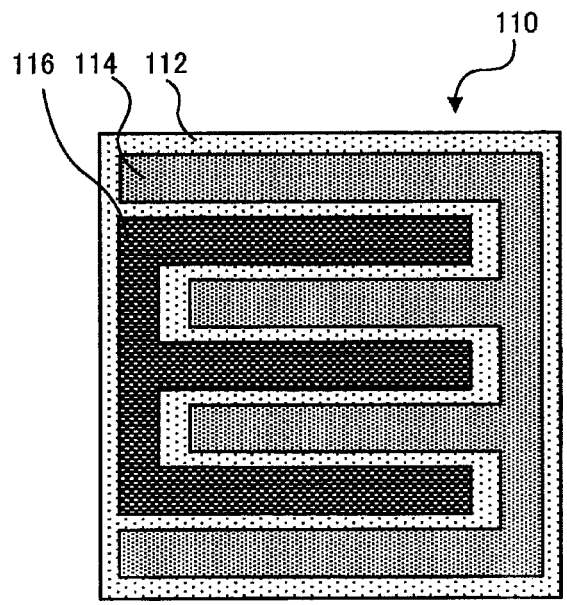
FIG. 11 is a schematic plan view of a back surface in an example of a back contact solar cell.
Figure 12:
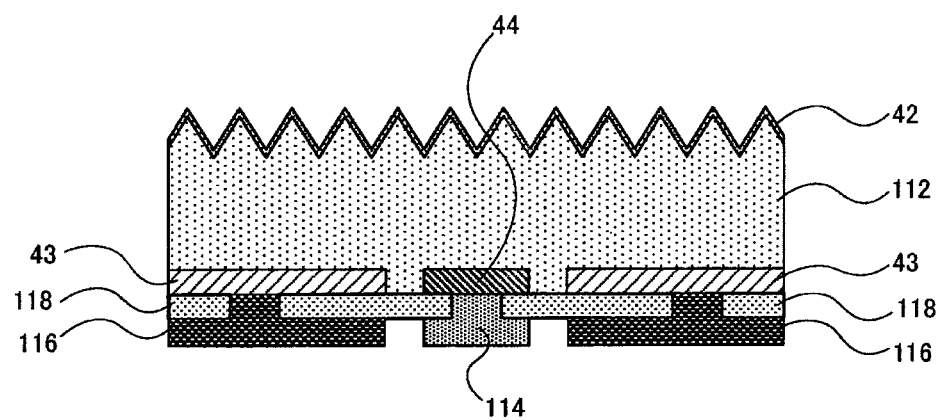
FIG. 12 is a schematic cross-sectional view showing an example of a back contact solar cell.
Figure 13:
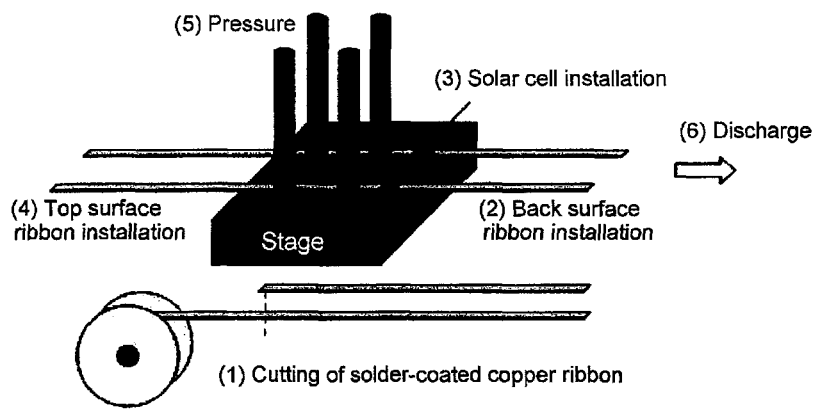
FIG. 13 is a schematic view showing an example of a wiring material connecting device used in a conventional solar cell module production method.

FIG. 11 shows a schematic plan view of a back surface in one example of the back contact solar cell 110. FIG. 12 shows a schematic cross-sectional view of an example of the back contact solar cell 110. The back contact solar cell 110 enables incident light to enter into the solar cell without waste since an electrode is not arranged on the light incident side surface, thereby making this advantageous for increasing the efficiency of solar cells.

In the back contact solar cell 110 as shown in FIG. 11 and FIG. 12, an electrode 114 of a first polarity (such as a negative electrode) and an electrode 116 of a second polarity (such as a positive electrode) are both arranged on the back surface. The electrodes 114 and 116 having first and second polarities are formed so as to contact a p-type diffusion layer (p-type silicon layer) 43 and the n-type diffusion layer (n-type silicon layer) 44 formed so as to be alternating with each other, or in other words, so as to have an interdigitated form. In addition, by forming a back surface passivation layer 118 on the back surface of an n-type silicon substrate 112 having the p-type diffusion layer 43 and the n-type diffusion layer 44 formed thereon prior to forming the electrodes 114 and 116 having the first and second polarities, recombination of carriers (conduction electrons and holes) can be prevented during power generation and conversion efficiency can be improved. Furthermore, the back surface passivation layer 118 has openings for allowing the electrodes 114 and 116 having the first and second polarities to contact the p-type diffusion layer 43 and the n-type diffusion layer 44. Efficiency loss caused by reflection of incident light at the top surface can be reduced by arranging the anti-reflection film 42 on the top surface (light incident side surface) of the solar cell. In addition, the anti-reflection film 42 can also have the function of a top surface passivation film depending on the type thereof.

Next, an explanation is provided of the solar cell module production method of the present invention.

The solar cell module production method of the present invention includes a step of preparing a plurality of solar cells having a first main surface and a second main surface, and having an electrode on at least one main surface of the first main surface and the second main surface.

The first main surface and second main surface of the solar cell refer to the light incident side surface (top surface) and back surface of the solar cell. In the case of the double-sided electrode-type solar cell 10, electrodes are arranged on both the first main surface and the second main surface. In addition, in the case of the back contact solar cell 110, an electrodes are only arranged on the back surface (one of the main surfaces).

The solar cell module production method of the present invention includes a step of arranging a plurality of solar cells so that the first main surfaces of the plurality of solar cells face roughly in the same direction. The "first main surfaces of the plurality of solar cells face roughly in the same direction" refers to, for example, the plurality of solar cells shown in FIG. 6 being arranged in a line so that the same surfaces face the same direction and the printed electrode patterns have roughly in the same orientation. As a result, the plurality of solar cells is arranged in a form like that shown in FIG. 1. Namely, the plurality of solar cells is arranged so that those sections of the electrode pattern that contact a continuous linear conductor 20 to be subsequently described are roughly parallel to the linear conductor 20.

The solar cell module production method of the present invention includes a step of connecting a linear conductor for electrically connecting at least one of each electrode on the first main surface and each electrode on the second main surface of the plurality of solar cells with at least one continuous linear conductor 20.

Figure 2:
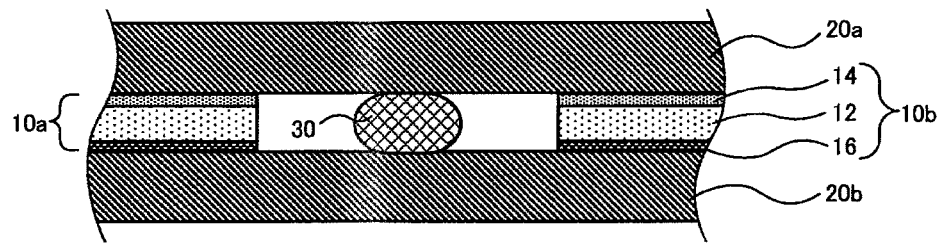
FIG. 2 is a schematic cross-sectional view of the vicinity of the dotted line circle indicated with reference symbol B in FIG. 1.

FIGS. 1 and 2 indicate an example of connecting the double-sided electrode-type solar cell 10 with the linear conductor 20. FIG. 1 is a schematic plan view of the light incident side surface showing an example of electrically connecting the light-incident side surfaces of a plurality of double-sided electrode-type solar cells 10a and 10b with two continuous linear conductors 20. FIG. 2 is a schematic cross-sectional view of the vicinity of the dotted line circle indicated by reference symbol B in FIG. 1. In the example shown in FIG. 2, back surface electrodes are also electrically connected with the continuous linear conductors 20 in addition to the electrodes on the light incident side surface. In the example shown in FIG. 2, the top surface side linear conductor 20 is represented by a first linear conductor 20a, while the back surface side linear conductor 20 is represented by a second linear conductor 20b. Both the first linear conductor 20a and the second linear conductor 20b may be simply referred to as the linear conductor 20.

In the step of connecting the linear conductor, electrodes present on the first main surface (such as the top surface) are electrically connected with a prescribed number of continuous linear conductors 20, and electrodes present on the second main surface (such as the back surface) are electrically connected with a prescribed number of different continuous linear conductors 20. Namely, in the present aspect of the solar cell module production method of the present invention, the continuous linear conductors 20 are not arranged so as to go around from the back surface to the top surface. In the example shown in FIG. 2, the first linear conductor 20a is arranged only on the top surface side, while the second linear conductor 20b is arranged only on the back surface side. Thus, according to the present invention, in the case of arranging a prescribed number of the continuous linear conductors 20, the solar cells and continuous linear conductors 20 can be easily arranged since it is not necessary to arrange the continuous linear conductors 20 so as to go around from one side to the other side of the solar cells.

Furthermore, in a step of forming electrical connections between adjacent solar cells to be subsequently described, series connections can be formed between adjacent double-sided electrode-type solar cells 10a and 10b by cutting prescribed sections of the linear conductors 20.

Figure 4:
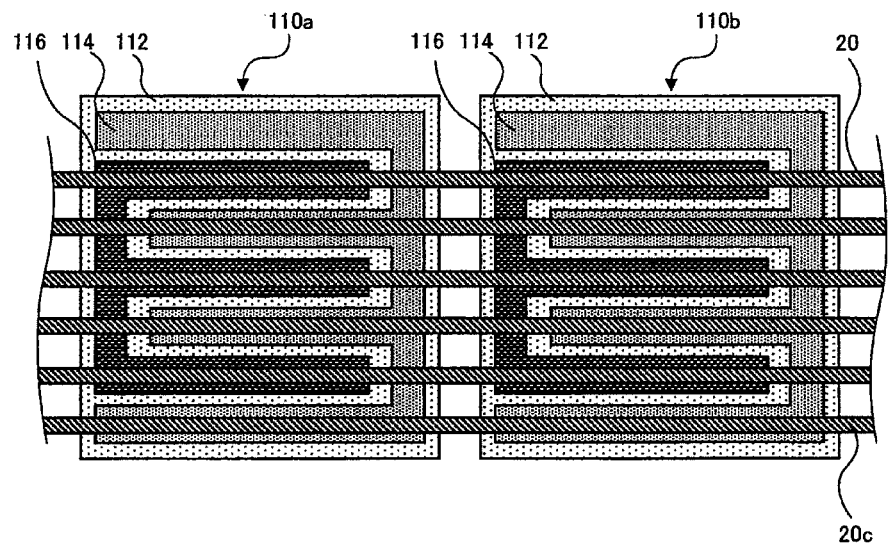
FIG. 4 is a schematic plan view showing an example of electrically connecting a plurality of continuous linear conductors to the back surface of a back contact solar cell.

FIG. 4 shows a schematic plan view of a back surface of an example of the back contact solar cell 110. In FIG. 4, an example is shown in which electrodes on the back surface of a plurality of back contact solar cells 110 (electrodes 114 and 116 having first and second polarities) are electrically connected with a plurality of the continuous linear conductors 20 (and 20c). At this time, the plurality of continuous linear conductors 20 connects all of the electrodes regardless of the type of electrode, or in other words, regardless of whether the electrodes are positive electrodes or negative electrodes. Furthermore, in the case of the back contact solar cells 110, the continuous linear conductors 20 are only required to be arranged on the back surface since there are no electrodes present on the light incident side surface.

The continuous linear conductors 20 are wiring materials for electrically connecting the plurality of solar cells, and when a prescribed number of solar cells are arranged to form a solar cell module, a length of the continuous linear conductors 20 is sufficient for transversely connecting all of at least a prescribed number of the solar cells.

The solar cell module production method of the present invention is preferably such that the continuous linear conductor 20 is a simple linear conductor or has a coating layer of solder and/or a low melting point metal on the surface of a simple linear conductor.

In the case the continuous linear conductor 20 is a simple linear conductor, a ribbon-shaped metal wire, such as copper wire, having, for example, a width of 1 mm to 2.5 mm and thickness of 0.15 mm to 0.3 mm can be used. The linear conductor 20 and the electrodes of the solar cells can be electrically connected by crimping.

In the case the continuous linear conductor 20 is a linear conductor, a linear conductor 20 can be used that is obtained by coating a ribbon-shaped metal wire, such as a copper wire, having, for example, a width of 1 mm to 2.5 mm and thickness of 0.15 mm to 0.3 mm with solder (tin-lead solder or lead-free solder such as tin-silver-copper solder). The linear conductor 20 and the electrodes of the solar cells can be electrically connected by soldering and the like.

The aforementioned continuous linear conductor 20 and the electrodes of the solar cells can also be electrically connected by brazing or applying a conductive paste other than crimping and soldering.

Electrical connection is preferably carried out by soldering. In this case, the linear conductor 20 and electrodes can be connected using a method in which the linear conductor 20 is connected to the electrodes by means of the solder coating layer on the linear conductor 20 by using non-cleaning flux. In addition, connections in an electrically continuous section 30 to be subsequently described can also be carried out in the same manner.

In addition, connections between the linear conductor 20 and electrodes may also be formed by applying solder paste containing flux to the linear conductor 20 or cell electrodes and heating. In this method, solder that has melted into the shape of the cell surface is coated in a self-aligning manner only on the underlying silver electrodes due to the surface tension of the liquid solder, while surfaces other than that of the electrodes are not coated. Consequently, this method is preferable in that it reduces concern over increased blockage of light caused by protruding joining materials.

The solar cell module production method of the present invention includes a step of forming electrical connections between adjacent solar cells so that the electrodes of at least one pair of adjacent solar cells among the plurality of solar cells are connected in series. The solar cell module production method of the present invention is characterized by electrically disconnecting the continuous linear conductor 20 in a step following the step of connecting a linear conductor.

Figure 3:
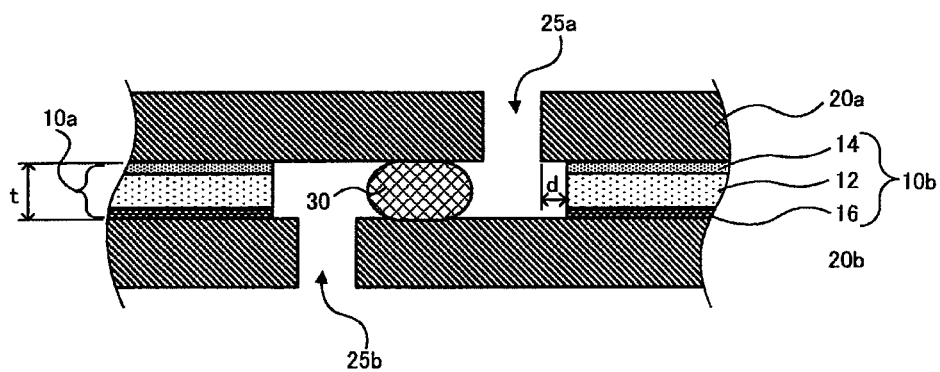
FIG. 3 is a schematic cross-sectional view showing an example of a double-sided electrode-type solar cell of the present invention.

As shown in FIG. 3, in the case of the double-sided electrode-type solar cell 10, the first linear conductor 20a is cut at a cut section 25a, and the second linear conductor 20b is cut at a cut section 25b. In this manner, adjacent solar cells 10a and 10b can be connected in series by cutting the first linear conductor 20a and the second linear conductor 20b at prescribed locations. Furthermore, in the example shown in FIG. 3, the first linear conductor 20a of the solar cell 10a and the second linear conductor 20b of the solar cell 10b are shown to be electrically connected through the electrically continuous section 30 in order to form a series connection. The electrically continuous section 30 will be subsequently described.

Figure 5:
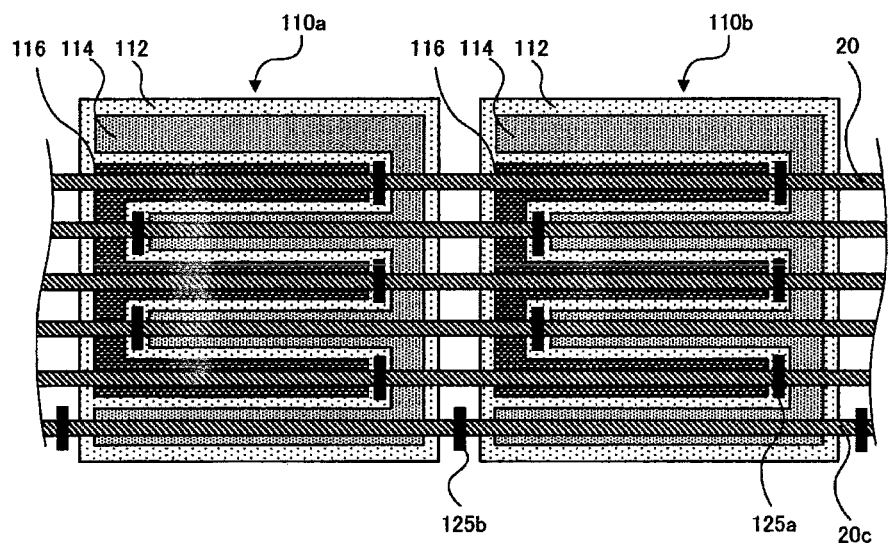
FIG. 5 is a schematic plan view of the back surface of an example of a back contact solar cell of the present invention. The black rectangles indicate locations where the electrodes have been cut.

As shown in FIG. 5, in the case of back contact solar cells 110a and 110b as well, the adjacent back contact solar cells 110a and 110b can be connected in series by cutting the linear conductor 20 at the prescribed linear conductor cut sections 125a and 125b. Furthermore, differing from the double-sided electrode-type solar cell 10, it is not necessary to form an electrically continuous section 30 in the case of the back contact solar cells 110a and 110b.

In the solar cell module production method of the present invention, a physical or chemical cutting method for removing a portion of the linear conductor 20 can be used to electrically disconnect the continuous linear conductor 20. Mechanically cutting with a rotary blade (such as a rotary blade coated with diamond powder), cutting with a laser, shearing, fusing or sublimation, for example, can be used as a physical or chemical cutting method. Cutting with a laser can be preferably applied since it enables the cut location to be set comparatively freely by programmable computer control. In addition, the linear conductor 20 can also be electrically disconnected by making a portion of the linear conductor 20 non-conductive instead of removing a portion thereof. Metal that composes the linear conductor 20 can be made to be non-conductive by changing the metal to an insulator by, for example, oxidizing the metal.

As has been explained above, according to the production method of the present invention in which series connections of a plurality of solar cells are formed by using a prescribed continuous linear conductor 20, since the linear conductor 20 is not required to be arranged so as to go around one side to the other side of the solar cell, the solar cell module can be produced with high productivity.

Next, a more detailed explanation is provided of the solar cell module production method of the present invention with respect to an aspect thereof that is applied to produce a double-sided electrode-type solar cell module with reference to FIGS. 1 to 3 (and FIGS. 6 and 7 with respect to plan views of a double-sided electrode-type solar cell).

In the present aspect, a plurality of solar cells have electrodes 14 and 15 of a first polarity on a first main surface and electrodes 16 and 17 of a second polarity on a second main surface. The first main surface is the top surface or back surface, while the second main surface is the surface on the opposite side therefrom. In the invention of the present aspect, an explanation is provided for the case of the first main surface being the top surface (light incident side surface). In addition, in the case the electrodes 14 and 15 of the first polarity are positive electrodes, the electrodes 16 and 17 of the second polarity are negative electrodes. In addition, in the case the electrodes 14 and 15 of the first polarity are negative electrodes, the electrodes 16 and 17 of the second polarity are positive electrodes. In the invention of the present aspect, an explanation is provided for the case in which the electrodes 14 and 15 of the first polarity are negative electrodes and the electrodes 16 and 17 of the second polarity are positive electrodes.

Furthermore, the electrodes 14 and 15 of the first polarity on the first main surface refer to top surface electrodes of the light incident side surface (top surface bus bar electrodes 14 and/or light-incident side finger electrodes 15). In addition, although the electrodes 16 and 17 of the second polarity on the second main surface are basically back surface bus bar electrodes 16, the back full surface electrode 17 may also be included.

As shown in FIG. 1, in the step of connecting the linear conductor of the present aspect, the electrodes 14 and 15 of the first polarity (negative electrodes) on the first main surface (top surface) of the plurality of solar cells are electrically connected with at least one continuous first linear conductor 20a. In addition, the electrodes 16 and 17 of the second polarity (positive electrodes) on the second main surface (back surface) of the plurality of solar cells are electrically connected with at least one continuous second linear conductor 20b.

As shown in FIGS. 1 and 2, in the step of connecting the linear conductor of the present aspect, bus bar electrodes 14 on the top surface of adjacent solar cells 10a and 10b (see FIG. 6) are first connected with the linear conductor 20a and the bus bar electrodes 16 on the back surface (see FIG. 7) are connected with the linear conductor 20b when electrically connecting the adjacent solar cells 10a and 10b in series.

In the step of forming electrical connections between adjacent solar cells of the present aspect, an electrically continuous section 30 is formed between adjacent solar cells so as to as to create electrical continuity between the first linear conductor 20a connecting the electrodes 14 and 15 of the first polarity (negative electrodes) of adjacent solar cells and the second linear conductor 20b connecting the electrodes 16 of the second polarity (positive electrodes) of adjacent solar cells. As shown in FIG. 2, the first linear conductor 20a and the second linear conductor 20b are short-circuited at the electrically continuous section 30.

In the present aspect, the method used to form the electrically continuous section 30 between adjacent solar cells in the first linear conductor 20a and the second linear conductor 20b is preferably one type selected from among pressure welding between the linear conductors 20, welding, melting a low melting point metal layer coated onto the surface of the linear conductors 20, melting and integrating solder layers, inserting a lead wire, melting solder by supplying a solder past and adhering by applying a conductive paste, or a combination thereof.

A metal wire can be used for the electrically continuous section 30 in order to form the electrically continuous section 30. Namely, the electrically continuous section 30 can be formed by inserting a metal wire and arranging so as to be orthogonal to the first and second linear conductors 20a and 20b to electrically connect the metal wire with the first and second linear conductors 20a and 20b. Although there are no particular limitations on the diameter of the metal wire, the diameter of the metal wire is preferably greater than the thickness of the solar cells since this makes it possible to reduce stress on the solar cells when connected.

The electrically continuous section 30 can also be formed without inserting a metal wire and the like as described above simply by crimp deforming and welding the first and second linear conductors 20a and 20b. In addition, examples of other methods that can be used include forming a solder coating layer on the first and second linear conductors 20a and 20b and then welding with the solder coating layer, and coating the linear conductors 20a and 20b with a conductive adhesive.

In the step of forming electrical connections between adjacent solar cells of the present aspect, the first linear conductor 20a is electrically disconnected between the electrically continuous section 30 and the electrodes 14 and 15 of the first polarity (negative electrodes) of one of the solar cells (such as solar cell 10a) of the pair of adjacent solar cells. In addition, the second linear conductor 20b is electrically disconnected between the electrically continuous section 30 and the electrodes 16 and 17 of the second polarity (positive electrodes) of the other solar cell (such as solar cell 10b) of the pair of adjacent solar cells. Thus, as shown in FIG. 3, the cut sections 25a and 25b are located so as to be point-symmetrical about the electrically continuous section 30. As a result of providing these cut sections 25a and 25b, the electrodes 14 and 15 of the first polarity of the solar cell 10a are electrically connected to the electrodes 16 and 17 of the second polarity of the adjacent solar cell 10b through the electrically continuous section 30. In this manner, the adjacent solar cells 10a and 10b can be connected in series.

Furthermore, the distance between the pair of adjacent solar cells in the present aspect is preferably 1 mm to 10 mm and more preferably 2 mm to 10 mm. This is because a prescribed distance is required between the solar cells since it is necessary to form the electrically continuous section 30.

In addition, in the present aspect, the first linear conductor 20a is preferably cut at a location d (mm) from the end of the other solar cell (solar cell 10b). Here, d satisfies the relationship of $0 \leq d < 10$ t, where t (mm) represents the thickness of the solar cell including electrodes. As a result of making d to be within a prescribed range, short-circuiting caused by the cut section of the first linear conductor 20a extending to the second linear conductor 20b arranged on the back surface can be prevented. Furthermore, the second linear conductor 20b is also preferably cut at a location at a prescribed distance d (mm) from the end for the same reason.

Furthermore, in the solar cell module production method of the present aspect as described above, formation of the electrically continuous section 30 and electrical disconnection of the first and second linear conductors 20a and 20b at a prescribed location may be carried out in the reverse order. In addition, electrical disconnection of the first and second linear conductors 20a and 20b at a prescribed location can be carried out immediately after having connected the first and second linear conductors 20a and 20b between two adjacent solar cells. In addition, electrical disconnection of the first and second linear conductors 20a and 20b at a prescribed location may also be carried out on 3 or more of a prescribed number of solar cells (such as the number of cells corresponding to a single string or the number of cells corresponding to a single module) after having connected the first and second linear conductors 20a and 20b.

As has been described above, in the solar cell module production method of the present aspect of the present invention, a string can be formed by connecting electrodes of the same polarity of adjacent solar cells with the linear conductors 20, followed by cutting at a prescribed location to form a series connection. In the solar cell module production method of the present invention, the first and second linear conductors 20*a* and 20*b* can be collectively connected to the double-sided electrode-type solar cells of a single string followed by cutting a prescribed section to form strings. Consequently, the solar cell module production method of the present invention is a highly productive production method.

The solar cell module production method of the present invention as described above has the following advantages in comparison with conventional methods.

(1) Since cutting of the wiring materials (linear conductors 20) is carried out after having connected the solar cells and cutting materials, there is little misalignment between the wiring materials and electrodes.

(2) Since the wiring materials can be cut after having fixed a plurality of wiring materials to the solar cells, it becomes easy to accommodate increases in the number of wires attributable to the wiring materials as well as reduced thickness of the wiring materials.

(3) A sheet for temporarily fixing a plurality of wiring materials is not required, thereby eliminating the generation of waste.

Next, a more detailed explanation is provided of the solar cell module production method of the present invention with respect to an aspect applied to the production of a back contact solar cell module.

In the present aspect, a plurality of solar cells has both an electrode 114 of a first polarity and an electrode 116 of a second polarity on a second main surface. In the case of the back contact solar cell 110 used in the present embodiment, the second main surface is the back surface. In addition, in the case the electrode 114 of the first polarity is a positive electrode, the electrode 116 of the second polarity is a negative electrode. In addition, in the case the electrode 114 of the first polarity is a negative electrode, the electrode 116 of the second polarity is a positive electrode. In the explanation of the present aspect, an explanation is provided for the case of the electrode 114 of the first polarity being a negative electrode and the electrode 116 of the second polarity being a positive electrode.

As shown in FIG. 4, in the step of arranging a plurality of solar cells of the present aspect, the plurality of solar cells is arranged so that the lengthwise direction of the electrode 114 of the first polarity (negative electrode) and the electrode 116 of the second polarity (positive electrode) is the same direction as the direction in which the plurality of solar cells is arranged. As shown in FIG. 4, the plurality of solar cells is arranged in a line so that the electrode patterns of the plurality of solar cells have the same orientation.

As shown in FIG. 4, in the step of connecting the linear conductor of the present aspect, the electrode 114 of the first polarity and the electrode 116 of the second polarity are electrically connected over the lengthwise direction thereof with at least one continuous linear conductor 20 in each of the plurality of solar cells. The continuous linear conductor 20 shown in FIG. 4 is connected to both the electrode 114 of the first polarity and the electrode 116 of the second polarity of a single solar cell 110*a*. Similarly, the linear conductor 20 is connected to both the electrode 114 of the first polarity and the electrode 116 of the second polarity in a solar cell 110*b* as well.

Furthermore, the linear conductor 20*c* shown in FIG. 4 is only connected to the electrode 114 of the first polarity. Thus, the linear conductor 20*c* differs from the aforementioned linear conductor 20. However, since the linear conductor 20*c* is connected so as to overlap the electrode 114 of the first polarity, electrical resistance of the electrode 114 of the first polarity can be lowered substantially.

As shown in FIG. 5, in the step of forming electrical connections between adjacent solar cells in the present aspect, the linear conductors 20 connected between adjacent solar cells are electrically disconnected with the exception of the linear conductor 20 that continuously connects the electrode of one polarity of one solar cell with the electrode of the other polarity of the other solar cell. Namely, in this step of the present aspect, among the linear electrodes 20 connected between adjacent solar cells, the linear conductor 20*c* that connects the same type of electrodes is cut between the adjacent solar cells (cut section 125*b*). The cut section 125 is a cut section located between the solar cells.

In addition, as shown in FIG. 5, in the step of forming electrical connections between adjacent solar cells of the present aspect, continuous linear conductors 20 between electrodes of one polarity and electrodes of the other polarity in each of the plurality of solar cells are electrically disconnected. In FIG. 4, these cut sections are indicated as black rectangles (cut sections 125*a*) in each of the solar cells 110*a* and 110*b*. These cut sections 125*a* are cut sections located between an electrode of one polarity and an electrode of the other polarity within a solar cell.

As has been described above, adjacent solar cells 110*a* and 110*b* can be connected in series by forming the cut portions 125*a* in the linear conductors 20 and the cut portion 125*c* in the linear conductor 20*c*.

In the solar cell module production method of the present aspect of the present invention, the linear conductors 20 can be collectively connected to the back-surface electrode-type solar cells 110 of a single string followed by cutting at prescribed sections to form strings. Consequently, the solar cell module production method of the present invention is a highly productive production method.

Next, an explanation is provided of a preferable aspect of the solar cell module production method of the present invention.

In the solar cell module production method of the present aspect, the step of arranging a plurality of solar cells includes arranging those solar cells corresponding to the number of solar cells in a single module roughly in the same plane, and arranging the solar cells to form a plurality of strings arranged in parallel. Furthermore, a string refers to prescribed number of a plurality of solar cells connected in series in a line within a solar cell module.

In the solar cell module production method of the present aspect, the step of electrically connecting adjacent solar cells includes the formation of electrical connections between adjacent solar cells so that all adjacent solar cells that form a string are connected in series. Strings can be formed in a solar cell module by the highly productive wiring method of the solar cell module production method of the present aspect.

Next, an explanation is provided of a more preferable aspect of the solar cell module production method of the present invention.

In the solar cell module production method of the present aspect, a plurality of strings is arranged so that adjacent strings have mutually opposite polarity in the connecting direction. In the present aspect, the plurality of strings contained in the solar cell module is connected in series as a result of electrically connecting an end of one string with an end of another adjacent string.

According to the present aspect, since a plurality of strings are arranged so that adjacent strings have mutually opposite polarity in the connecting direction, adjacent strings can be connected in series by electrically connecting the ends of adjacent strings. As a result, strings of a solar cell module can be connected in series by a simple method. Thus, strings of a solar cell module can be formed by highly productive wiring method in the solar cell module production method of the present aspect.

Next, an explanation is provided of a more preferable aspect of the solar cell module production method of the present invention.

In this aspect of the present invention, when solar cells corresponding to the same order in strings (a prescribed number of strings) arranged in a single module (number of cells equal to the number of strings) are defined as one row, the steps of connecting the electrodes and linear conductors of the solar cells, forming an electrically continuous section 30 with wires orthogonal to the linear conductors 20, and cutting the linear conductors 20 are carried out for each row while sequentially advancing one row at a time to connect all of the solar cells corresponding to a single module in series. According to the present aspect, when defining the solar cells corresponding to the number of rows of strings in a single module as 1 row, the solar cells can be wired by the linear conductors 20 while sequentially advancing one row at a time. Consequently, production of the solar cell module can be carried out with higher efficiency.

In the present aspect, a solar cell module can be formed even more efficiently by intermittently repeating a procedure by which the electrical connections of a row of solar cells in the transverse direction, namely the direction perpendicular to the linear conductors 20 of the solar cell module (longitudinal direction), are formed collectively. At this time, rod-shaped ribbons (wires) can form electrical connections with the linear conductors 20 over a plurality of collectively processed solar cell modules in order to form the electrically continuous sections 30. In this case, it is necessary to isolate the electrically continuous sections 30 in the form of rod-shaped ribbons between strings. Furthermore, in the case of connecting the strings in parallel so that polarity is in the same direction, the electrically continuous section 30 can be formed over the rod-shaped ribbon, thereby eliminating the need to isolate the electrically continuous section 30 between strings.

Next, an explanation is provided of the solar cell module of the present invention. The solar cell module of the present invention is a solar cell module having double-sided electrode-type solar cells 10.

The present invention is a solar cell module containing a plurality of solar cells electrically connected by the linear conductor 20. The solar cell module of the present invention has at least one string. The string has a prescribed number of a plurality of solar cells such that mutually adjacent solar cells are connected in series in a line.

As was explained in the solar cell module production method of the previously described aspect that uses double-sided electrode-type solar cells, the solar cells used in the solar cell module of the present invention have electrodes 14 and 15 of a first polarity on a first main surface and electrodes 16 and 17 of a second polarity on a second main surface (see FIGS. 6 and 7). In addition, the first linear conductor 20a is electrically connected to the electrodes 14 and 15 of the first polarity on the first main surface of the solar cells, while the second linear conductor 20b is electrically connected to the electrodes 16 and 17 of the second polarity on the second main surface of the solar cells (see FIGS. 3, 6 and 7).

As shown in FIG. 3, in the solar cell module of the present aspect, the first linear conductor 20a of one of the solar cells and the second linear conductor 20b of the other solar cell in a pair of adjacent solar cells are electrically connected at the electrically continuous section 30.

In addition, as shown in FIG. 3, in the solar cell module of the present aspect, the first linear conductor 20a is electrically disconnected between the electrically continuous section 30 and the electrodes 14 and 15 of the first polarity of one of the pair of adjacent solar cells (cut section 25a). In addition, the second linear conductor 20b is electrically disconnected between the electrically continuous section 30 and the electrodes 116 and 117 of the second polarity of the other solar cell of the pair of adjacent solar cells (cut section 25b).

The solar cell module of the present aspect having the aforementioned can be produced by the highly productive solar cell module production method of the present invention. Thus, the solar cell module of the present aspect is a solar cell module that can be produced with high productivity.

In the solar cell module of the present aspect, the plurality of strings contained in the solar cell module are preferably connected in series by arranging the plurality of strings so that adjacent strings have mutually opposite polarity in the connecting direction and electrically connecting an end of one string with an end of the other mutually adjacent string. This type of solar cell module can be produced with even higher productivity.

In the solar cell module of the present invention, wiring materials (linear conductors 20) can be connected to electrodes using the wiring material connection device described below.

This wiring material connection device (to simply be referred to as the "connection device") can comprise: (1) a wiring material (linear conductor 20) supply unit, (2) a cell supply unit, (3) a cell electrode and wiring material combining/joining unit, (4) an inter-cell electrical continuity formation unit, and a (5) wiring cutting unit. In addition, the connection device can further comprise a (6) cleaning/drying unit as necessary.

The following provides a more detailed explanation of each unit of the connection device.

(I) The wiring material (linear conductor 20) supply unit consists of a group of longitudinal linear conductor rolls for connecting cells with a plurality of linear conductors 20, and is composed of a group of linear conductor rolls for the cell top surface electrodes and a group of linear conductor rolls for the back surface electrodes. In addition, a transverse wire supply roll is added in the case of using a transverse wire to form the electrically continuous section 30 by short-circuiting between the groups of linear conductors of both surfaces.

(2) Cells on which electrodes have been formed stored in a cassette are intermittently supplied to the next step one at a time from the cell supply unit.

(3) The cell electrode and wiring material combining/joining unit is composed of two crimping rollers, and fulfills the role aligning the positions of (1) the group of linear conductors 20 supplied from the wiring material (linear conductor 20) supply unit with (2) cells supplied from the cell supply unit between the rolls. In this device, the linear conductors 20 at this stage are in a state in which the top surface electrodes are mutually connected or the back surface electrodes are mutually connected between adjacent cells.

(4) The inter-cell electrical continuity formation unit is for forming a short-circuit section (electrically continuous section 30) for creating a current path between the cells required for series connection, and the linear conductor 20 arranged on the top surface electrodes and the linear conductor 20 arranged on the back surface electrodes are short-circuited by the electrically continuous section 30. The electrically continuous section 30 is formed by a method such as inserting a transverse wire between both linear conductors 20 followed by spot-welding, pressure welding or applying a solder paste or adhesive.

(5) The wiring cutting unit forms the cut section 25 of the linear conductor 20 for forming a current path from the top surface electrodes to the back surface electrodes through the electrically continuous section 30 formed in (4) the inter-cell electrically continuity formation unit. Cutting of the linear conductor 20 is made at locations nearly point-symmetrical to the electrically continuous section 30. As a result of cutting, the current path consists of the electrical continuous section 30 only and each adjacent cell is connected in series. Examples of methods used to cut the linear conductor 20 include cutting with a rotary blade coated with diamond powder, cutting with laser light (such as light from a YAG laser or picosecond laser) and shearing with a scissors and the like.

(6) The cleaning/drying unit discharges cuttings produced by cutting and cleans the flux.

As has been previously described, a solar cell module (solar cell panel) having environmental resistance can be obtained by sealing a plurality of solar cells suitably connected in series and/or in parallel using glass plates and sealing material and the like. Technology for sealing electrically connected solar cells using glass plates and sealing material and the like is known technology.

Next, an explanation is provided of another aspect of the solar cell module production method of the present invention using FIGS. 15 to 21. In the aspect shown in FIGS. 15 to 21, a double-sided electrode-type solar cell module can be produced by a highly productive wiring method.

Figure 15:
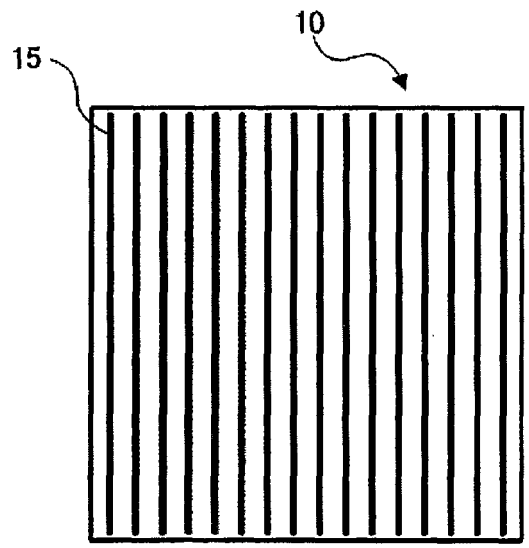
FIG. 15 is a schematic plan view of the arrangement of electrodes on the light incident side surface of a double-sided electrode-type solar cell able to be preferably used in another aspect of the solar cell module production method of the present invention.
Figure 16:
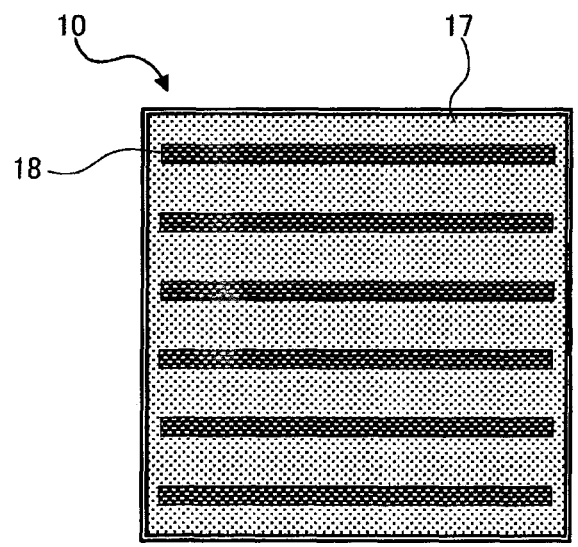
FIG. 16 is a schematic plan view of the arrangement of electrodes on the back surface of a double-sided electrode-type solar cell able to be preferably used in another aspect of the solar cell module production method of the present invention.

FIG. 15 shows a preferable arrangement of electrodes on a light incident side surface in the solar cell module production method of the present aspect. The electrodes on the light incident side surface of solar cells shown in FIG. 15 are in the form of finger electrodes 15 arranged thereon. FIG. 16 shows a preferable arrangement of back surface electrodes in the solar cell module production method of the present aspect. The electrodes on the light incident side surface of the solar cell shown in FIG. 16 consist of an arrangement of the back full surface electrode 17 and solderable regions 18. The back surface solderable regions 18 are electrodes having the same function as the back surface bus bar electrodes 16. Furthermore, the finger electrodes 15 and the back surface solderable regions 18 are of a form in which they extend linearly from one end to the other end of the solar cell. In addition, the finger electrodes 15 and the back surface solderable regions 18 are arranged so that the lengthwise directions thereof are mutually orthogonal. The first linear conductor 20*a* and the second linear conductor 20*b* are connected to the finger electrodes 15 and the back surface solderable regions 18.

Figure 17:
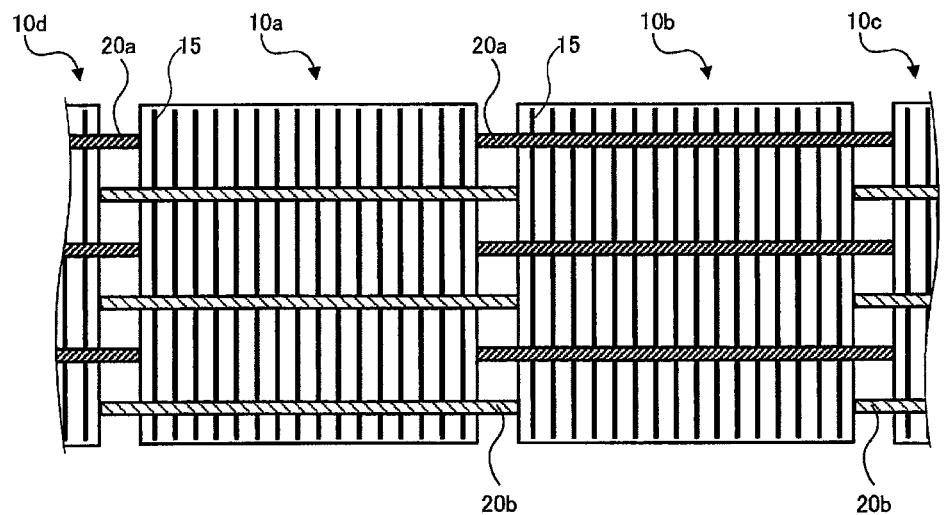
FIG. 17 is a schematic plan view of the light incident side surface of double-sided electrode-type solar cells showing a step of connecting a linear conductor of another aspect of the solar cell module production method of the present invention.
Figure 18:
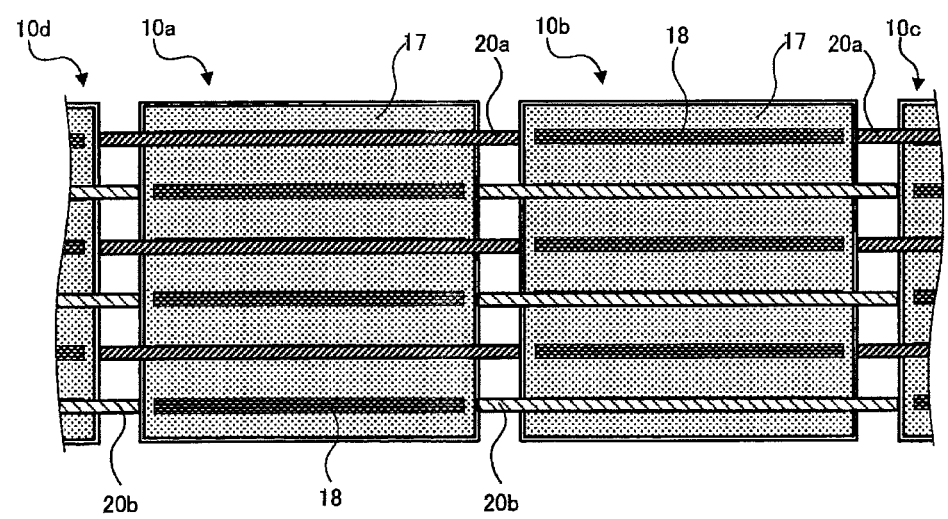
FIG. 18 is a schematic plan view of the back surface of double-sided electrode-type solar cells showing a step of connecting a linear conductor of another aspect of the solar cell module production method of the present invention.

FIGS. 17 and 18 illustrate the step of connecting the linear conductor of the solar cell module production method of the present aspect. In the step of connecting the linear conductor of this aspect, electrodes on different main surfaces of two adjacent solar cells among a plurality of solar cells are electrically connected with at least one continuous linear conductor. Namely, as shown in FIGS. 17 and 18, the first linear conductors 20*a* are electrically connected from the light incident side surface of a solar cell 10*d* to the back surface of an adjacent solar cell 10*a*, and are further electrically connected to the top surface of the next adjacent solar cell 10*b*. The second linear conductors 20*b* are arranged so as to connect to a main surface that differs from that of the first linear conductors 20*a*. Namely, as shown in FIGS. 17 and 18, two adjacent solar cells (such as solar cells 10*a* and 10*b*) are electrically connected with the first linear conductors 20*a* that connect electrodes of a first polarity (back surface electrodes in the case of FIGS. 17 and 18) of one of the solar cells 10*a* with electrodes of a second polarity (top surface electrodes in the case of FIGS. 17 and 18) of the other solar cell 10*b*. In addition, two adjacent solar cells are electrically connected with the second linear conductors 20*b* that connect electrodes of a second polarity (top surface electrodes in the case of FIGS. 17 and 18) of one of the solar cells 10*a* with electrodes of a first polarity (back surface electrodes in the case of FIGS. 17 and 18) of the other solar cell 10*b*.

Figure 19:
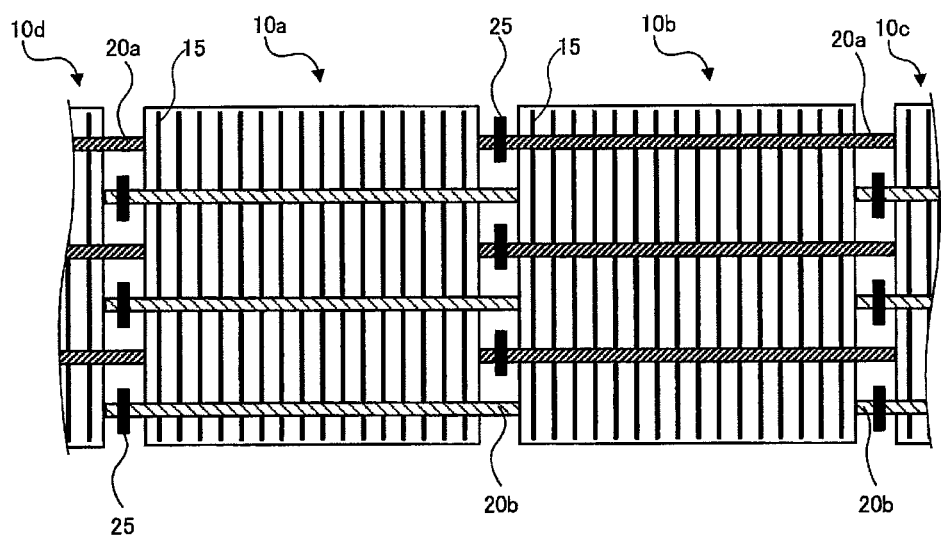
FIG. 19 is a schematic plan view showing a step of forming an electrical connection between adjacent solar cells in another aspect of the solar cell module production method of the present invention. The black rectangles indicate locations where the electrodes have been cut.

Next, in the step of forming electrical connections between adjacent solar cells in the solar cell module production method of the present aspect, continuous linear conductors are electrically disconnected at prescribed locations so that the electrodes of adjacent solar cells are connected in series. As shown in FIG. 19, the first linear conductors 20*a* are electrically disconnected between two adjacent solar cells 10*a* and 10*b*. In addition, the second linear conductors 20*b* are electrically disconnected between the two adjacent solar cells 10*a* and 10*b* and other solar cells 10*c* and 10*d* adjacent to the two adjacent solar cells 10*a* and 10*b*. Namely, the second linear conductors 20*b* are electrically disconnected between the solar cell 10*a* and the solar cell 10*d* and between the solar cell 10*b* and the solar cell 10*c*. As a result, the solar cells 10*d*, 10*a*, 10*b* and 10*c* are connected in series.

The following provides a more detailed explanation of the solar cell module production method of the present invention using FIGS. 20 to 24.

Figure 20:
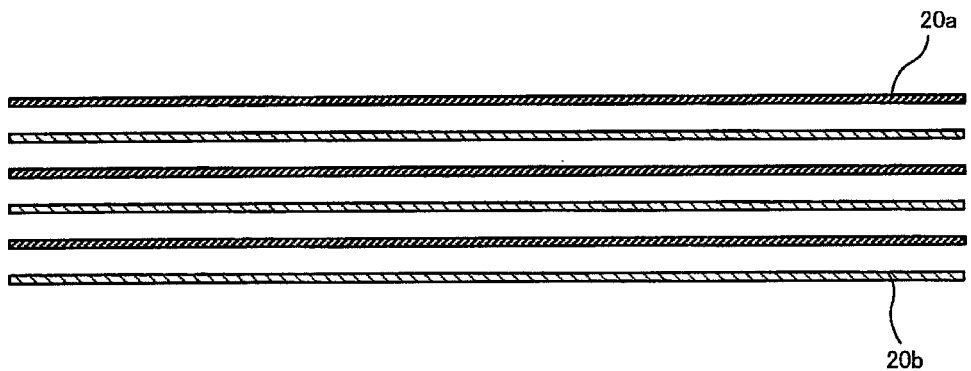
FIG. 20 is a schematic plan view showing an example of the arrangement of a plurality of first linear conductors and second linear conductors in another aspect of the solar cell module production method of the present invention.

As shown in FIG. 20, a plurality of the first linear conductors 20*a* and a plurality of the second linear conductors 20*b* are prepared. Furthermore, the first linear conductors 20*a* and the second linear conductors 20*b* can be made of the same material.

Figure 21:
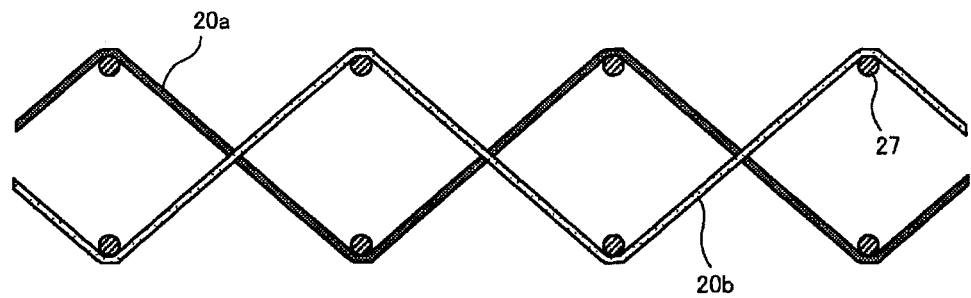
FIG. 21 is a schematic side view showing an example of having formed spaces enabling the insertion of solar cells between a plurality of first linear conductors and second linear conductors in another aspect of the solar cell module production method of the present invention.

Next, as shown in FIG. 21, the plurality of the first linear conductors 20*a* and the plurality of the second linear conductors 20*b* are pulled in mutually different vertical directions using a prescribed jig to form spaces between the plurality of the first linear conductors 20*a* and the second linear conductors 20*b* so as to allow insertion of the double-sided electrode-type solar cells 10 when viewed from the side.

Figure 22:
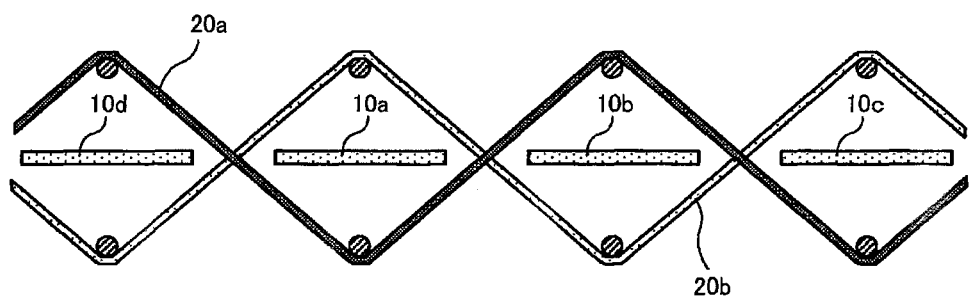
FIG. 22 is a schematic side view showing a step of arranging a plurality of solar cells in another aspect of the solar cell module production method of the present invention.

Next, as shown in FIG. 22, the double-sided electrode-type solar cells 10 are inserted between the first linear conductors 20*a* and the second linear conductors 20*b*. In this case, the plurality of solar cells is arranged so that the first main surfaces (such as the light incident side surfaces) of the double-sided electrode-type solar cells 10 are facing roughly in the same direction.

Figure 23:
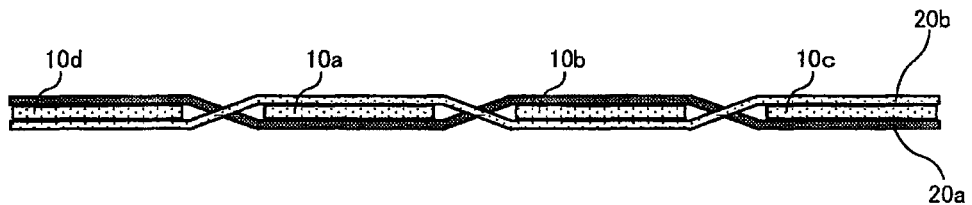
FIG. 23 is a schematic side view showing a step of connecting a linear conductor in another aspect of the solar cell module production method of the present invention.

Next, as shown in FIG. 23, the first linear conductors 20*a* and the second linear conductors 20*b* are contacted with the double-sided electrode-type solar cells 10 to electrically connect the first linear conductors 20*a* and the second linear conductors 20*b* to the double-sided electrode-type solar cells 10. The first linear conductors 20a and the second linear conductors 20b are electrically connected to the finger electrodes 15 and the back surface solderable regions 18 of the double-sided electrode-type solar cells 10.

Figure 24:
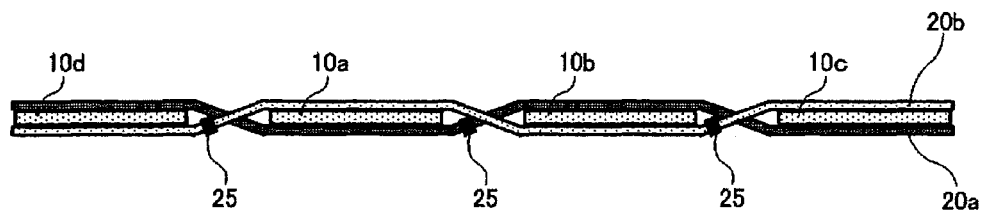
FIG. 24 is a schematic side view showing a step of forming an electrical connection between adjacent solar cells in another aspect of the solar cell module production method of the present invention.

Next, as shown in FIG. 24, the first linear conductors 20a and the second linear conductors 20b are electrically disconnected at prescribed locations so that the electrodes of adjacent solar cells are connected in series. A previously described method can be used for the electrical disconnection method.

Adjacent solar cells can also be connected in series to produce a solar cell module according to the aforementioned production method as well.

EXAMPLES

Figure 14:
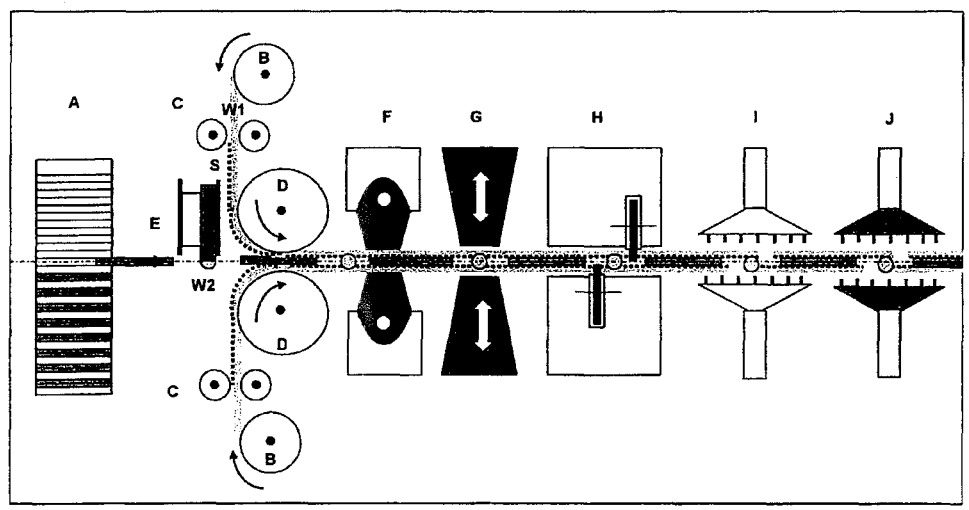
FIG. 14 is a schematic view showing an example of the solar cell module production method of the present invention.

The following provides a more detailed explanation of the solar cell module production method of the present invention using the example referred by FIG. 14.

In the present example, an explanation is provided of string formation using a crystalline silicon solar cell (BSF cell) that uses a p-type polycrystalline substrate or single crystalline silicon substrate.

A: Cell Substrate Stocker

Crystalline silicon solar cells on which electrodes have already been formed on the back surface and top surface thereof are stocked in the cell substrate stocker.

Production of crystalline silicon solar cells can be carried out in the following manner First, an n-type silicon emitter layer obtained by a phosphorous diffusion process is formed on a p-type crystalline silicon substrate having a texture structure formed thereon from which the damaged layer is removed. Next, a SiN:H passivation layer obtained by CVD is formed on the surface of the emitter layer. Next, screen printing with a conductive paste for the back surface electrodes (back full surface electrodes printed with aluminum paste and back surface bus bar electrodes printed with silver paste) and drying are carried out on the back surface, while screen printing with a conductive paste (silver paste) for the top surface (light incident side) and drying are carried out on the top surface. Back surface electrodes and top surface electrodes are formed by simultaneously firing the conductive paste on the back surface and top surfaces in air. In addition, this solar cell has a back surface field (BSF) on the back surface side thereof.

The electrode structure of the solar cells employed an electrode pattern composed of 82 finger electrodes 15 obtained with silver paste and having an average width of 70 μm and 3 bus bar electrodes 16 measuring 1.5 mm wide×154 mm long. The back surface electrodes are formed over nearly the entire back surface such that 3 bus bar electrodes obtained with silver paste and measuring 2 mm wide×154 mm long are formed in a direction perpendicular to the lengthwise direction of the top surface finger electrodes 15, and electrodes obtained with aluminum paste are electrically connected with the 3 bus bar electrodes. Silver paste is printed in a prescribed electrode pattern on the top surface and silver paste is printed in the pattern of the bus bar electrodes on the back surface to form these top surface electrodes and back surface electrodes, and aluminum paste was printed for the back full surface electrode. After drying the printed silver paste and aluminum paste, the top surface electrodes and back surface electrodes were formed by simultaneously firing at a peak temperature of 800° C. in air and at a firing furnace in-out time of 1 minute. The electrode configuration explained above is currently the most popular electrode configuration. However, the present invention can also be applied to cases in which the solar cells used have other electrode configurations. For example, the present invention can also be applied even in the case of a solar cell in which the top surface electrodes consist only of finger electrodes without having a section for bus bar electrodes, and in the case of a solar cell employing an electrode configuration in which the lengthwise direction of bus bar electrodes on the back surface coincides with the lengthwise direction of finger electrodes on the top surface (and in this case, the linear conductors 20 are arranged perpendicular to the finger electrodes on the top surface and the bus bar electrodes on the back surface).

The dimensions of the solar cell are 156 mm×156 mm×0.18 mm. The cassette is able to hold 20 cells, for example. The top surface finger electrodes 15 are placed in the cassette so as to be perpendicular to the group of longitudinal wires (linear conductors 20).

B: Longitudinal Wire (Linear Conductor 20) Supply Roll

The longitudinal wire (linear conductor 20) supply roll holds 15 rolls of solder-plated copper wire having a diameter of 0.3 mm for the top surface electrodes and 15 rolls of the solder-plated copper wire for the back surface electrodes.

C: Solder Paste Coating Device

Commercially available solder paste (solder paste manufactured by Senju Metal Industry Co., Ltd., L23-BLT5-T7F (Sn: 42 parts by weight, Ag: 1 part by weight, Bi: 57 parts by weight)) was used for the solder paste after diluting with butyl carbitol to adjust viscosity. Solder paste was coated onto the side of the longitudinal wire (linear conductors 20) that adheres with the cells.

D: Temporary Crimping Rollers

The temporary crimping rollers are rollers for carrying out temporary crimping by alternately pinching the conductive wires (used to form the electrically continuous section 30) and solar cells with the top surface wires (electrical conductors 20) and the back surface wires (linear conductors 20).

E: Transverse Conductive Wire Supply Roll

The transverse conductive wire supply roll supplies lead wire (transverse wire) for creating electrical continuity (forming the electrically continuous section 30) between the top surface wires and back surface wires between cells. Wires having a diameter of 0.3 mm were used. Furthermore, a wire diameter of 0.3 mm is thicker than the thickness of 0.18 mm of the solar cells.

F: Solder Melting Heater

The solder melting heater is used to solder the top surface electrodes and back surface electrodes of the cells, the top surface wires (linear conductors 20) and back surface wires (linear conductors 20), and the transverse conductive wires.

G: Thickness Adjustment Press

The thickness adjustment press adjusts the thickness of the electrically continuous section 30 by crushing both of the soldered wires (linear conductors 20) and transverse conductive wires between the cells.

H: Wire Cutter

The wire cutter cuts both wires (linear conductors 20) at locations point-symmetrical to the electrically continuous section 30 to form a circuit path so that adjacent solar cells are connected in series. Cutting is carried out by using the pressing surface adjusted by the thickness adjustment press G as a reference surface followed by sliding to cut the wires.

I: Cleaner

Removal of cuttings by cleaning and cleaning of residual flux are carried out by the cleaner.

J: Dryer

The dryer carries out drying after cleaning by the cleaner.

The aforementioned device is intermittently operated to form strings in accordance with the configuration of 10 cells.

<Joining of Solar Cells and Wires (Linear Conductors 20)>

The solar cells were joined to the group of wires (linear conductors 20) adhered to the top surface electrodes and back surface electrodes by first coating the wires with solder paste, contacting the top surface and back surface of the cells, and then using the solder paste as a temporary adhesive. In this case, the solder is only coated onto the surface of the preliminarily formed silver electrodes (top surface electrodes and back surface electrodes) due to the surface tension of the solder during melting, thereby making this preferable since there are no concerns over increasing the light area. In addition, this also serves as a cushioning material that reduces pressure on the substrate.

<Top and Back Wire Short-Circuiting Between Cells>

In the present example, the electrically continuous section 30 of the top surface wires (linear conductors 20) and back surface wires (linear conductors 20) was formed using transverse wires. The diameter of the transverse wires (diameter: 0.3 mm) was made to be greater than the thickness of the silicon solar cells in consideration of being able to reduce pressure on the substrate during crimping.

<Wire (Linear Conductor 20) Cutting>

Although the interval between wires soldered to the top surface and back surface electrodes between cells is dependent on the thickness of the cells (0.18 mm in the present example), precise cutting is required since the two wires are close together. In the present example, the diameter of the transverse wires was made to be equal to or greater than the thickness of the solar cells, and the thickness was made to be constant by pressing the intersecting portions of the back surface and top surface wires (linear conductors 20) and transverse wires. Cutting depth was then determined using this constant thickness as a reference. The blade was moved in the direction perpendicular to the plane of the paper to cut 15 wires on the top surface and 15 wires on the back surface.

In addition, an experiment was also conducted in which overlapping wires were cut with a YAG laser. Cutting conditions of the YAG device used consisted of a repetition frequency of 20 KHz, output of 3 W and processing speed of 10 mm/min Wires having a diameter of 0.3 mm were able to be cut at a width of 0.05 mm as a result of this cutting. Although wires in the lower portions of the solar cells were somewhat damaged by this cutting, the wires were confirmed to be able to be cut without causing electrical problems.

Since cutting with laser light enables programmable control of the cut location, the cut location can be selected more freely while also increasing the range of use. A cutting method using a picosecond laser can also be used, and this allows the obtaining of more desirable results in terms of elimination of thermal damage and reduction of splashing. In addition, a mechanical cutting method in the manner of shearing with scissors can also be used that is less likely to produce cuttings.

The locations where the wires are cut between cells are preferably locations close to the cell ends. The reason for this is that there is less risk of short-circuiting even if cut wires make contact in the vertical direction.

<Collective Module Formation from Multiple Strings>

Although the present example has been explained for the case of forming strings in which 10 cells are connected in series per row, this technology can also be applied to form electrical connections in series between the cells contained in one module (containing, for example 6 strings of 10 cells/string each). In this case, six row of cells can be wired collectively and this procedure can be intermittently repeated 10 times to form a matrix of 6×10 cells.

EXPLANATION OF LETTERS AND NUMERALS

10 Double-sided electrode-type solar cell
12 Crystalline silicon substrate
14 Top surface bus bar electrode (electrode of first polarity)
15 Finger electrode (electrode of first polarity)
16 Back surface bus bar electrode (electrode of second polarity)
17 Back full surface electrode (electrode of second polarity)
18 Back surface solderable region
20 Linear conductor
20a First linear conductor
20b Second linear conductor
20c Linear conductor
25 Linear conductor cut section
25a First linear conductor cut section
25b Second linear conductor cut section
27 Linear conductor retaining jig
30 Electrically continuous section
42 Anti-reflection film
43 Impurity diffusion layer (p-type impurity diffusion layer)
44 Impurity diffusion layer (n-type impurity diffusion layer)
110 Back contact solar cell
112 Crystalline silicon substrate
114 Electrode of first polarity
116 Electrode of second polarity
125a Linear conductor cut section
125b Linear conductor cut section
d Distance from end of solar cell to cut section of first linear conductor (mm)
t Solar cell thickness (mm)

The invention claimed is:

1. A method for producing a solar cell module, comprising:

preparing three or more solar cells having a first main surface and a second main surface and having an electrode of a first polarity and an electrode of a second polarity on the second main surface, arranging three or more solar cells so that the first main surfaces of the three or more solar cells face roughly in the same direction, electrically connecting the three or more solar cells with at least one continuous linear conductor in order to electrically connect the electrode of the first polarity and the electrode of the second polarity on the second main surface of each solar cell with the at least one continuous linear conductor, and forming an electrical connection between adjacent solar cells so that the electrodes of at least one pair of adjacent solar cells among the three or more solar cells are connected in series, which includes electrically disconnecting the continuous linear conductor after the connecting the linear conductor, wherein:

the arranging three or more solar cells comprises arranging the three or more solar cells so that the lengthwise direction of the electrode of the first polarity and the electrode of the second polarity is the same direction as the direction in which the three or more solar cells are arranged, and the electrode patterns of the three or more solar cells have the same orientation, the connecting the linear conductor comprises electrically connecting each of the three or more solar cells with at least one continuous linear conductor over the lengthwise direction of the electrode of the first polarity and the electrode of the second polarity, and the forming an electrical connection between adjacent solar cells comprises:

electrically disconnecting the continuous linear conductors between adjacent solar cells other than the linear conductor that continuously connects an electrode of one polarity of one of the solar cells with the electrode of the other polarity of the other solar cell, and electrically disconnecting the continuous linear conductor by removing a portion of the linear conductor between the electrode of one polarity and the electrode of the other polarity in each of the three or more solar cells.

2. The method for producing a solar cell module according to claim 1, wherein the continuous linear conductor is a linear conductor formed of ribbon-shaped metal wire or has a coating layer of solder and/or a low melting point metal on the surface of the linear conductor formed of ribbon-shaped metal wire.

3. The method for producing a solar cell module according to claim 1, wherein the connecting the linear conductor comprises electrically connecting electrodes with at least one continuous linear conductor by adhering by crimping, soldering, brazing or applying a conductive paste.

4. The method for forming a solar cell module according to claim 1, wherein electrical disconnection of the continuous linear conductor is carried out by mechanically cutting with a rotary blade, shearing, fusing, sublimation or making the linear conductor non-conductive.

5. The method for producing a solar cell module according to claim 1, wherein the arranging the three or more solar cells comprises arranging three or more solar cells corresponding to the number of solar cells in a single module in roughly the same plane and arranging the solar cells to form a plurality of strings arranged in parallel, the strings consisting of a prescribed number of the three or more solar cells arranged in series in a line, and the forming an electrical connection between adjacent solar cells comprises forming an electrical connection between adjacent solar cells so that the electrodes of all adjacent solar cells that form strings are connected in series.

6. The method for producing a solar cell module according to claim 5, wherein a plurality of strings are arranged so that adjacent strings have mutually opposite polarity in the connecting direction, and comprises connecting the plurality of strings contained in the solar cell module in series by electrically connecting an end of a string with an end of another adjacent string.

* * * * *